(12) United States Patent
Nugent

(10) Patent No.: US 9,104,975 B2
(45) Date of Patent: *Aug. 11, 2015

(54) MEMRISTOR APPARATUS

(75) Inventor: Alex Nugent, Santa Fe, NM (US)

(73) Assignee: KnowmTech, LLC, Santa Fe, NM (US)

( * ) Notice: Subject to any disclaimer, the term of this patent is extended or adjusted under 35 U.S.C. 154(b) by 462 days.

This patent is subject to a terminal disclaimer.

(21) Appl. No.: 13/421,398

(22) Filed: Mar. 15, 2012

(65) Prior Publication Data

US 2012/0175583 A1    Jul. 12, 2012

Related U.S. Application Data

(63) Continuation-in-part of application No. 12/100,586, filed on Apr. 10, 2008, now Pat. No. 8,156,057, which is a continuation of application No. 10/969,789, filed on Oct. 21, 2004, now Pat. No. 7,398,259, and a continuation-in-part of application No. 10/730,708, filed on Dec. 8, 2003, now abandoned, said application No. 10/969,789 is a continuation-in-part of application No. 10/095,273, filed on Mar. 12, 2002, now Pat. No. 6,889,216, and a continuation-in-part of application No. 10/162,524, filed on Jun. 5, 2002, now abandoned, and a continuation-in-part of application No. 10/226,191, filed on Aug. 22, 2002, now abandoned, and a continuation-in-part of application No. 10/748,546, filed on Dec. 30, 2003, now Pat. No. 7,392,230, and a continuation-in-part of application (Continued)

(51) Int. Cl.
| | | |
|---|---|---|
| *G06E 1/00* | (2006.01) | |
| *G06E 3/00* | (2006.01) | |
| *G06F 15/18* | (2006.01) | |
| *G06G 7/00* | (2006.01) | |
| *G06N 3/063* | (2006.01) | |
| *H03K 19/00* | (2006.01) | |

(52) U.S. Cl.
CPC ............... *G06N 3/063* (2013.01); *H03K 19/00* (2013.01)

(58) Field of Classification Search
CPC ..... G06N 3/0635; G06N 3/063; G06N 3/049; G06N 3/02; G06F 15/00; G06F 15/18; G06E 1/00; G06E 3/00; G06G 7/00
See application file for complete search history.

(56) References Cited

U.S. PATENT DOCUMENTS

| | | |
|---|---|---|
| 5,699,234 A | 12/1997 | Saia et al. |
| 5,794,224 A | 8/1998 | Yufik |
| 6,171,239 B1 | 1/2001 | Humphrey |
| 6,889,216 B2 | 5/2005 | Nugent |
| 6,995,649 B2 | 2/2006 | Nugent |
| 7,028,017 B2 | 4/2006 | Nugent |
| 7,039,619 B2 | 5/2006 | Nugent |
| 7,107,252 B2 | 9/2006 | Nugent |
| 7,392,230 B2 | 6/2008 | Nugent |
| 7,398,259 B2 | 7/2008 | Nugent |
| 7,409,375 B2 | 8/2008 | Nugent |
| 7,412,428 B2 | 8/2008 | Nugent |
| 7,420,396 B2 | 9/2008 | Nugent |
| 7,426,501 B2 | 9/2008 | Nugent |
| 7,502,769 B2 | 3/2009 | Nugent |
| 7,599,895 B2 | 10/2009 | Nugent |
| 7,752,151 B2 | 7/2010 | Nugent |
| 7,827,130 B2 | 11/2010 | Nugent |
| 7,827,131 B2 | 11/2010 | Nugent |

(Continued)

OTHER PUBLICATIONS

Specification for U.S. Appl. No. 13/908,410, Nugent, Jun. 3, 2013.*

(Continued)

*Primary Examiner* — Kakali Chaki
*Assistant Examiner* — Peter Coughlan
(74) *Attorney, Agent, or Firm* — Kermit D. Lopez; Luis M. Ortiz; Ortiz & Lopez, PLLC

(57) ABSTRACT

A memristor apparatus comprising a plurality of meta-stable switching elements.

12 Claims, 23 Drawing Sheets

Related U.S. Application Data

No. 10/748,631, filed on Dec. 30, 2003, now Pat. No. 7,412,428, and a continuation-in-part of application No. 10/730,708, filed on Dec. 8, 2003, now abandoned, said application No. 13/421,398 is a continuation-in-part of application No. 12/612,677, filed on Nov. 5, 2009, now Pat. No. 8,332,339, and a continuation-in-part of application No. 12/938,537, filed on Nov. 3, 2010, now abandoned, and a continuation-in-part of application No. 12/974,829, filed on Dec. 21, 2010, now Pat. No. 8,781,983, and a continuation-in-part of application No. 13/113,167, filed on May 23, 2011, and a continuation-in-part of application No. 13/354,537, filed on Jan. 20, 2012, and a continuation-in-part of application No. 13/268,119, filed on Oct. 7, 2011, now abandoned.

(60) Provisional application No. 60/458,024, filed on Mar. 27, 2003.

(56) References Cited

U.S. PATENT DOCUMENTS

| | | | |
|---|---|---|---|
| 2003/0177450 A1 | 9/2003 | Nugent | |
| 2003/0236760 A1 | 12/2003 | Nugent | |
| 2004/0039717 A1 | 2/2004 | Nugent | |
| 2004/0153426 A1 | 8/2004 | Nugent | |
| 2004/0162796 A1 | 8/2004 | Nugent | |
| 2004/0193558 A1 | 9/2004 | Nugent | |
| 2004/0249319 A1 | 12/2004 | Dariush | |
| 2005/0015351 A1 | 1/2005 | Nugent | |
| 2005/0149464 A1 | 7/2005 | Nugent | |
| 2005/0149465 A1 | 7/2005 | Nugent | |
| 2005/0151615 A1 | 7/2005 | Nugent | |
| 2005/0256816 A1 | 11/2005 | Nugent | |
| 2006/0036559 A1 | 2/2006 | Nugent | |
| 2006/0184466 A1 | 8/2006 | Nugent | |
| 2007/0005532 A1 | 1/2007 | Nugent | |
| 2007/0022064 A1 | 1/2007 | Nugent | |
| 2007/0117221 A1 | 5/2007 | Nugent et al. | |
| 2007/0176643 A1 | 8/2007 | Nugent | |
| 2008/0090337 A1* | 4/2008 | Williams | 438/133 |
| 2008/0258773 A1 | 10/2008 | Nugent | |
| 2009/0043722 A1 | 2/2009 | Nugent | |
| 2009/0138419 A1 | 5/2009 | Nugent | |
| 2009/0163826 A1* | 6/2009 | Mouttet | 600/544 |
| 2009/0228415 A1 | 9/2009 | Nugent | |
| 2009/0228416 A1 | 9/2009 | Nugent | |
| 2009/0292661 A1* | 11/2009 | Haas | 706/33 |
| 2010/0274447 A1* | 10/2010 | Stumpf | 701/36 |
| 2010/0277232 A1* | 11/2010 | Snider | 327/565 |
| 2010/0280982 A1 | 11/2010 | Nugent | |
| 2010/0299297 A1 | 11/2010 | Breitwisch et al. | |
| 2011/0137843 A1 | 6/2011 | Poon et al. | |
| 2011/0145179 A1 | 6/2011 | Nugent | |
| 2012/0078827 A1 | 3/2012 | Nugent | |

OTHER PUBLICATIONS

Cameron, K. et al., "Spike Timing Dependent Plasticity (STDP) can Ameliorate Process Variations in Neuromorphic VLSI," IEEE Transactions on Neural Networks (2005) 16(6):1626-1637.

Masquelier, T. et al., "Competitive STDP-Based Spike Pattern Learning," Neural Computation (2009) 21:1259-1276.

Masquelier, T. et al., "Unsupervised Learning of Visual Features through Spike Timing Dependent Plasticity," PLoS Comput. Biol. (2007) 3(2): 0247-0257.

Roberts, P. D. et al., "Model of auditory prediction in the dorsal cochlear nucleus via spike-timing dependent plasticity," Neurocomputing (2006) 69:1191-1194.

Yang, Z. et al., "Vision Coincidence Detection with STDP Adaptation for Object Recognition and Depth Analysis," Brain Inspired Cognitive Systems (2004) University of Stirling, Scotland, UK, Aug. 29-Sep. 1, 6 pages.

Zhao, G., "Synaptic modification and entrained phase are phase dependent in STDP," Nature Proceedings May 28, 2008, 25 pages.

Yufik, Y. M., "Virtual Associative Networks: A Framework for Cognitive Modeling," Brian and Values: Is a Biological Science of Values Possible (1998) Lawrence Erlbaum Associates, Inc., Pribram, K. H. (ed.), Mahway, NJ, pp. 109-177.

Yufik, Y. M. et al., "Swiss Army Knife and Ockham's Razor: Modeling and Facilitating Operator's Comprehension in Complex Dynamic Tasks," IEEE Transactions on Systems, Man, and Cybernetics—Part A: Systems and Humans (2002) 32(2):185-199.

Yufik, Y. M., "How the Mind Works: Art Exercise in Pragmatism," Inst. of Med. Cybern. Inc. (2002) Gaithersburg, MD, 5 pages.

Farries, M. A. et al., "Reinforcement Learning with Modulated Spike Timing-Dependent Synaptic Plasticity," J. Neurophysiol. (2007) 98:3648-3665.

Kushner, S. A. et al., "Modulation of Presynaptic Plasticity and Learning by the H-ras/Extracellular Signal-Regulated Kinase/Synapsin 1 Signaling Pathway," The Journal of Neuroscience (2005) 25(42):9721-9734.

Schultz, W., "Multiple Reward Signals in the Brain," Neuroscience (2000) 1:199-207.

* cited by examiner

MEMRISTOR APPARATUS

CROSS-REFERENCE TO PATENT APPLICATIONS

This patent application Is a continuation-in-part of U.S. patent application Ser. No. 12/100,586 entitled "Adaptive Neural Network Utilizing Nanotechnology-Based Components," which was filed on Apr. 10, 2008 now U.S. Pat. No. 8,156,057, and is incorporated herein by reference in its entirety. U.S. patent application Ser. No. 12/100,586 is in turn a continuation of U.S. patent application Ser. No. 10/969,789, which was filed on Oct. 21, 2004 now U.S. Pat. No. 7,398,259, and claims priority as a Continuation-in-Part of U.S. patent application Ser. No. 10/730,708, entitled "Adaptive Neural Network Utilizing Nanotechnology-Based Components," which was filed on Dec. 8, 2003, now abandoned, which in turn claims priority to U.S. Provisional Patent Application Ser. No. 60/458,024 filed on Mar. 27, 2003. U.S. patent application Ser. No. 10/969,789 is a continuation-in-part of U.S. patent application Ser. No. 10/095,273, "Physical Neural Network Design Incorporating Nanotechnology," which was filed on Mar. 12, 2002, now U.S. Pat. No. 6,889,216, the disclosure of which is incorporated herein by reference. U.S. patent application Ser. No. 10/969,789 is also a continuation-in-part of U.S. patent application Ser. No. 10/162,524, "Multi-Layer Training in a Physical Neural Network Formed Utilizing Nanotechnology," which was filed on Jun. 5, 2002, now abandoned, the disclosure of which is incorporated herein by reference. U.S. patent application Ser. No. 10/969,789 is additionally a continuation-in-part of U.S. patent application Ser. No. 10/226,191, "High-Density Synapse Chip Using Nanoparticles," which was filed on Aug. 22, 2002, now abandoned, the disclosure of which is incorporated herein by reference. U.S. patent application Ser. No. 10/969,789 is also a continuation-in-part of U.S. patent application Ser. No. 10/748,546, "Physical Neural Network Liquid State Machine Utilizing Nanotechnology," which was filed on Dec. 30, 2003, now U.S. Pat. No. 7,392,230, the disclosure of which is incorporated herein by reference. U.S. patent application Ser. No. 10/969,789 is also a continuation-in-part of U.S. patent application Ser. No. 10/748,631, "Application of Hebbian and Anti-Hebbian Learning to Nanotechnology-Based Physical Neural Networks," which was filed on Dec. 30, 2003, now U.S. Pat. No. 7,412,428, the disclosure of which is incorporated herein by reference. U.S. patent application Ser. No. 10/969,789 is also a continuation-in-part of U.S. patent application Ser. No. 10/730,708, "Adaptive Neural Network Utilizing Nanotechnology-Based Components," which was filed on Dec. 8, 2003, now abandoned, the disclosure of which is incorporated herein by reference. This application therefore traces and claims priority to the earliest priority date of U.S. patent application Ser. No. 10/095,273, "Physical Neural Network Design Incorporating Nanotechnology," which was filed on Mar. 12, 2002.

This patent application is also a continuation-in-part of U.S. patent application Ser. No. 12/612,677, filed on Nov. 5, 2009 now U.S. Pat. No. 8,332,339. U.S. patent application Ser. No. 12/612,677 is incorporated herein by reference in its entirety. This patent application is also a continuation-in-part of U.S. patent application Ser. No. 12/938,537, which was filed on Nov. 3, 2010 now abandoned. U.S. patent application Ser. No. 12/938,537 is incorporated herein by reference in its entirety. This patent application is also a continuation-in-part of U.S. patent application Ser. No. 12/974,829, which was filed on Dec. 21, 2010 now U.S. Pat. No. 8,781,983. U.S. patent application Ser. No. 12/974,829 is additionally incorporated herein by reference in its entirety. This patent application is additionally a continuation-in-part of U.S. patent application Ser. No. 13/113,167, which was filed on May 23, 2011. This patent application is also a continuation-in-part of U.S. patent application Ser. No. 13/354,537, which was filed on Jan. 20, 2012. U.S. patent application Ser. No. 13/354,537 is incorporated by reference herein in its entirety. This patent application is also a continuation of U.S. patent application Ser. No. 13/268,119, which was filed on Oct. 7, 2011 now abandoned. U.S. patent application Ser. No. 13/268,119 is also herein incorporated by reference in its entirety.

TECHNICAL FIELD

Embodiments generally relate to the field of thermodynamic computing. Embodiments additionally relate to memristor devices and logic gate components constructed that incorporate the use of unstable switching elements. Embodiments additionally relate to self-assembling and repairing methods and systems. Embodiments also relate to nanoscale meta-stable devices, such as Knowm™ synapses, switching molecules and cross bar switching architectures.

BACKGROUND

A memristor, also sometimes referred to as a "memory resistor" is a passive two-terminal electrical component that can function as a non-linear circuit element relating charge and magnetic flux linkage. When current flows in one direction through the device, the electrical resistance can increase. When current flows in the opposite direction, the resistance can decrease. When the current is stopped, the device retains the last resistance that it had, and when the flow of charge starts again, the resistance of the circuit will be what it was when it was last active. A memristor thus has a regime of operation with an approximately linear charge-resistance relationship as long as the time-integral of the current stays within certain bounds.

Devices based on thermodynamic computing have been implemented. One example of such a device is the Knowm™ network or system, which is described in a number of U.S. patents and publications publications. U.S. Pat. No. 6,889,216, entitled "Physical Neural Network Design Incorporating Nanotechnology," which issued to Alex Nugent on May 3, 2005 generally describes a physical neural network that generally includes one or more neuron-like nodes, which are formed from a plurality of interconnected nanoconnections formed from nanoconductors. Such connections constitute Knowm™ connections. Each neuron-like node sums one or more input signals and generates one or more output signals based on a threshold associated with the input signal.

The Knowm™ device physical neural network also includes a connection network formed from the interconnected nanoconnections, such that the interconnected nanoconnections used thereof by one or more of the neuron-like nodes are strengthened or weakened according to an application of an electric field, variations in frequency, and so forth. U.S. Pat. No. 6,889,216 is incorporated herein by reference.

Another example of a Knowm™ network or system is described in U.S. Patent Publication No. 20030236760, entitled "Multi-layer Training in a Physical Neural Network Formed Utilizing Nanotechnology," by inventor Alex Nugent, which was published on Dec. 25, 2003. U.S. Patent Publication No. 20030236760 generally describes methods and systems for training at least one connection network located between neuron layers within a multi-layer physical neural network (e.g., a Knowm™ network or device). The multi-layer physical neural network described in U.S. Patent Publication No. 20030236760 can be formed with a plurality of inputs and a plurality outputs thereof, wherein the multi-layer physical neural network comprises a plurality of layers therein, such that each layer thereof comprises at least one connection network and at least one associated neuron.

Thereafter, a training wave, as further described in U.S. Patent Publication No. 20030236760, can be initiated across one or more connection networks associated with an initial layer of the multi-layer physical neural network which propagates thereafter through succeeding connection networks of succeeding layers of the multi-layer physical neural network by successively closing and opening at least one switch associated with each layer of the multi-layer physical neural network. At least one feedback signal thereof can be automatically provided to each preceding connection network associated with each preceding layer thereof to strengthen or weaken nanoconnections associated with each connection network of the multi-layer physical neural network. U.S. Patent Publication No. 20030236760 is incorporated herein by reference.

A further example of a Knowm™ network or system is described in U.S. Patent Publication No. 20040039717, entitled High-density synapse chip using nanoparticles" by inventor Alex Nugent. U.S. Patent Publication No. 20040039717 published on Feb. 26, 2004 and generally describes a physical neural network synapse chip (i.e., a Knowm™ chip) and a method for forming such a synapse chip. The synapse or Knowm™ chip can be configured to include an input layer comprising a plurality of input electrodes and an output layer comprising a plurality of output electrodes, such that the output electrodes are located perpendicular to the input electrodes. A gap is generally formed between the input layer and the output layer.

A solution can then be provided which is prepared from a plurality of nanoconductors and a dielectric solvent. The solution is located within the gap, such that an electric field is applied across the gap from the input layer to the output layer to form nanoconnections of a physical neural network implemented by the synapse chip. Such a gap can thus be configured as an electrode gap. The input electrodes can be configured as an array of input electrodes, while the output electrodes can be configured as an array of output electrodes. U.S. Patent Publication No. 20040039717 is also incorporated herein by reference.

A further example of a Knowm™ network or system is disclosed in U.S. Patent Publication No. 20040153426, entitled "Physical Neural Network Liquid State Machine Utilizing Nanotechnology," by inventor Alex Nugent, which was published on Aug. 5, 2004. U.S. Patent Publication No. 20040153426 generally discloses a physical neural network (i.e., a Knowm™ network), which functions as a liquid state machine.

The physical neural network described in U.S. Patent Publication No. 20040153426 can be configured from molecular connections located within a dielectric solvent between pre-synaptic and post-synaptic electrodes thereof, such that the molecular connections are strengthened or weakened according to an application of an electric field or a frequency thereof to provide physical neural network connections thereof. A supervised learning mechanism is associated with the liquid state machine, whereby connections strengths of the molecular connections are determined by pre-synaptic and post-synaptic activity respectively associated with the pre-synaptic and post-synaptic electrodes, wherein the liquid state machine comprises a dynamic fading memory mechanism. U.S. Patent Publication No. 20040153426 is also incorporated herein by reference.

A further example of a Knowm™ network or system is disclosed in U.S. Patent Publication No. 20040162796, entitled "Application of Hebbian and anti-Hebbian Learning to Nanotechnology-based Physical Neural Networks" by inventor Alex Nugent, which published on Aug. 19, 2004. U.S. Patent Publication No. 20040162796 generally discloses a physical neural network (i.e., Knowm™ network) configured utilizing nanotechnology. The Knowm™ network disclosed in U.S. Patent Publication No. 20040162796 includes a plurality of molecular conductors (e.g., nanoconductors) which form neural connections between pre-synaptic and post-synaptic components of the physical neural network.

An alternative example of a nanoscale meta-stable switching element is the cross bar architecture. A molecular cross bar memory is disclosed, for example, in U.S. Pat. No. 6,128,214 entitled "Molecular Wire Cross bar Memory" which issued to Kuekes et al. on Oct. 3, 2000. Kuekes et al disclose a memory device that is constructed from cross bar arrays of nanowires sandwiching molecules that act as on/off switches. The device is formed from a plurality of nanometer-scale devices, each device comprising a junction formed by a pair of crossed wires where one wire crosses another and at least one connector species connects the pair of crossed wires in the junction. The connector species comprises a bi-stable molecular switch. The junction forms either a resistor or a diode or an asymmetric non-linear resistor. The junction possesses a state that is capable of being altered by application of a first voltage and sensed by the application of a second, non-destructive voltage. A series of related technology attempts to convert everything from molecular logic to how to chemically assemble these devices.

Such a molecular cross bar device has two general applications. The notion of transistors built from nanotubes and relying on nanotubes properties is being pursued. In this manner, computational systems can be constructed. Second, two wires can be selectively brought to a certain voltage and the resulting electrostatic force attracts them. When the wires touch, the Van der Waals force maintains the wires in contact with one another such that a "bit" is stored. The connections in such an apparatus can therefore be utilized with standard electronic circuitry.

One aspect of the cross bar architecture, which deserves some illumination, is its potential unreliability. The device functions by creating a physical system with one meta-stable state, which is formed from the balance of van der-walls intermolecular attraction and a mechanical tension from a bent nanowire. The van der-walls force must be made sufficient to oppose the mechanical strain. The construction of such a device preferably utilizes a nanowire suspended above a lower nanotube (or other nanoparticle) or electrical contact. The further apart the supports, the less of a force required to bend the nanowire. This has an interesting consequence when the system in scaled down.

As the switch density is increased, the support distance must necessarily decrease. This causes the force from mechanical strain to increase. One possible solution would be to place the nanowires closer together, so that less of a deflection is needed to make contact. There is an absolute distance, however, for which the nanowires cannot be brought closer, and this distance is set by quantum mechanical electron tunneling. In this manner, it can be seen that as the device is scaled down, the potential energy well formed from the Van der Waals force becomes weakened as the mechanical strain from the bent nanowire increases. This results in the connection having an increased probability of falling into the "ground state".

Alternately, switching molecules have been found that can be configured to be in a conducting and a non-conducting state. To date, one problem with such molecules is that the states are only meta-stable, particularly one of the states. After a short time, which usually decreases as the temperature is increased, the state is lost. If the "on" state represents a conducting state, then this naturally raises the question, "how does one work with an unreliable connection?" It is the purpose of this disclosure to apply a type of local interaction so as to work with an unreliable connection, or alternately to constantly repair a connection if it undergoes a transition from a meta-stable to a ground state. This methodology can be used in, for example, Knowm™ connection networks, nanowire cross junctions and meta-stable switching molecules such as rotoxane. The methodology has been first described for Knowm™ connection networks, and its extension to other nanoscale implementations is unexpected. In all cases, we can refer to pre- and post-synaptic electrodes, where a Knowm™ connection, nanowire junction, switching molecule, quantum tunneling transistor and the like forms the pre-to-post electrode switching contact. In all cases, the device is configured to work with a meta-stable nanoscale switch, which we will describe in detail and offer examples.

A local feedback mechanism can be applied, which implements Hebbian and anti-Hebbian learning. Such a learning mechanism can utilize a voltage gradient or voltage gradient dependencies to implement Hebbian and/or anti-Hebbian (AHAH) plasticity. The learning mechanism can also utilize pre-synaptic and post-synaptic frequencies to provide Hebbian and/or anti-Hebbian learning within the physical neural network. U.S. Patent Publication No. 20040162796 is incorporated herein by reference.

An additional example of a Knowm™ network or device is disclosed in U.S. Patent Publication No. 20040193558, entitled "Adaptive Neural Network Utilizing Nanotechnology-based Components" by Alex Nugent, which published on Sep. 30, 2004. U.S. Patent Publication No. 20040193558 generally describes methods and systems for modifying at least one synapse of a physical neural network (i.e., a Knowm™ network). The physical neural or Knowm™ network described in U.S. Patent Publication No. 20040193558 can be implemented as an adaptive neural network, which includes one or more neurons and one or more synapses thereof.

The synapses are formed from a plurality of nanoparticles disposed within a dielectric solution in association with one or more pre-synaptic electrodes and one or more post-synaptic electrodes and an applied electric field. Alternately, the synapses are formed from a plurality of nanowire cross junctions formed from two or more nanowires composed of, for example, carbon nanotubes and forming one or more pre-synaptic electrodes and one or more post-synaptic electrodes. Alternately, The synapses are formed from a plurality of switching molecules formed from one or more molecule of, for example, Rotoxane, preferably located between two or more pre- and post-synaptic electrodes comprising, for example, carbon nanotubes or photolithography defined and patterned electrodes.

At least one electric pulse can be generated from one or more of the neural circuit modules to one or more of the pre-synaptic electrodes of a succeeding neuron and one or more post-synaptic electrodes of one or more of the neurons of the synapse junction, thereby strengthening at least one nanoparticle of a plurality of nanoparticles disposed within the dielectric solution and at least one synapse thereof. At least one electric pulse can be generated from one or more of the neural circuit modules to one or more of the pre-synaptic electrodes of a succeeding neuron and one or more post-synaptic electrodes of one or more of the neurons of the synapse junction, thereby configuring the state of at least one meta-stable switch of a plurality of meta-stable switches disposed within the dielectric solution and at least one synapse thereof. U.S. Patent Publication No. 20040193558 is incorporated herein by reference.

Another example of a Knowm™ network or device is disclosed U.S. Patent Publication No. 20050015351, entitled "Nanotechnology Neural Network Methods and Systems" by inventor Alex Nugent, which published on Jan. 20, 2005. U.S. Patent Publication No. 20050015351 generally discloses a physical neural network (i.e., a Knowm™ network), which constitutes a connection network comprising a plurality of molecular conducting connections suspended within a connection gap formed between one or more input electrodes and one or more output electrodes. One or more molecular connections of the molecular conducting connections can be strengthened or weakened according to an application of an electric field, frequency, and the like across the connection gap.

The notion of a connection network can be applied to a nanoscale architecture of the cross bar array. Rather than a Knowm™ synapse forming a connection at the intersection of the cross bar, the connection is formed by the mechanical contact of the electrodes themselves, which are implemented as nanowires. When two wires are raised to opposing voltages, columbic attraction brings the wires together. Charging the wires can be used to overcome the Van der Waals attractive force and allows the mechanical strain to bring the nanowire to its ground state. The same self-organizing principles that were developed for a Knowm connection can be applied to an unreliable cross-bar electrode junction.

The notion of a connection network can be applied to a nanoscale switching molecule architecture. Rather than a Knowm™ synapse forming a connection at the intersection of the cross bar, the connection is formed by one or more switching molecules composed of, but not limited to, Rotoxane. In general, all that is required is a two-state system, where an impedance change can be measured between the two states. In addition, it is preferable that one of the states is unstable and has a non-zero probability of transition to the ground state. When two wires are raised to opposing voltages, an electric field is generated that switches the molecules into the meta-stable state. The same self-organizing principles that were developed for a Knowm connection can be applied to a meta-stable switching molecule architecture.

An example of meta-stable switching is disclosed in U.S. Pat. No. 7,599,895 entitled, "Methodlogy for the Configuration and Repair of Unreliable Switching Elements," which issued on Oct. 6, 2009 to Alex Nugent, which is incorporated herein by reference in its entirety.

As transistor densities on modern integrated electronic chips increase, there is a growing trend toward reconfigurable architectures. Rather than implementing application specific integrated circuits (ASIC), it is preferred that a design be deployed on programmable logic devices. The move in such a direction is creating a growing trend toward an IP-based development process, where circuits are defined by their programming routine rather than the actual physical layout. Rather than implementing a program to run on a processor, for example, a chip may process a program to build the processor.

In view of the foregoing developments in thermodynamic computing and the need for reconfigurable architectures it is believed that one solution toward creating such technology involves the implementation of improved memristor devices, systems and components.

BRIEF SUMMARY

The following summary is provided to facilitate an understanding of some of the innovative features unique to the embodiments, and is not intended to be a full description. A full appreciation of the various aspects of the embodiments can be gained by taking the entire specification, claims, drawings, and abstract as a whole.

It is, therefore, one aspect of the disclosed embodiments to provide for a memristor apparatus based on a collection of meta-stable switching elements.

It as another aspect of the disclosed embodiments to provide for local interaction mechanism capable of re-configuration of states of nano-scale meta-stable switches.

It is another aspect of the disclosed embodiments to provide for electronic components, which can be formed utilizing the self-assembling principles disclosed herein.

It is yet another aspect of the disclosed embodiments to provide a mechanism for the reconfiguration of electronic components utilizing self-assembling principles.

It is yet another aspect of the disclosed embodiments to provide a circuit-level implementation of a universal logic gate utilizing the self-assembling principles disclosed herein.

The above and other aspects can be achieved as is now described.

DETAILED DESCRIPTION

Figure 1:
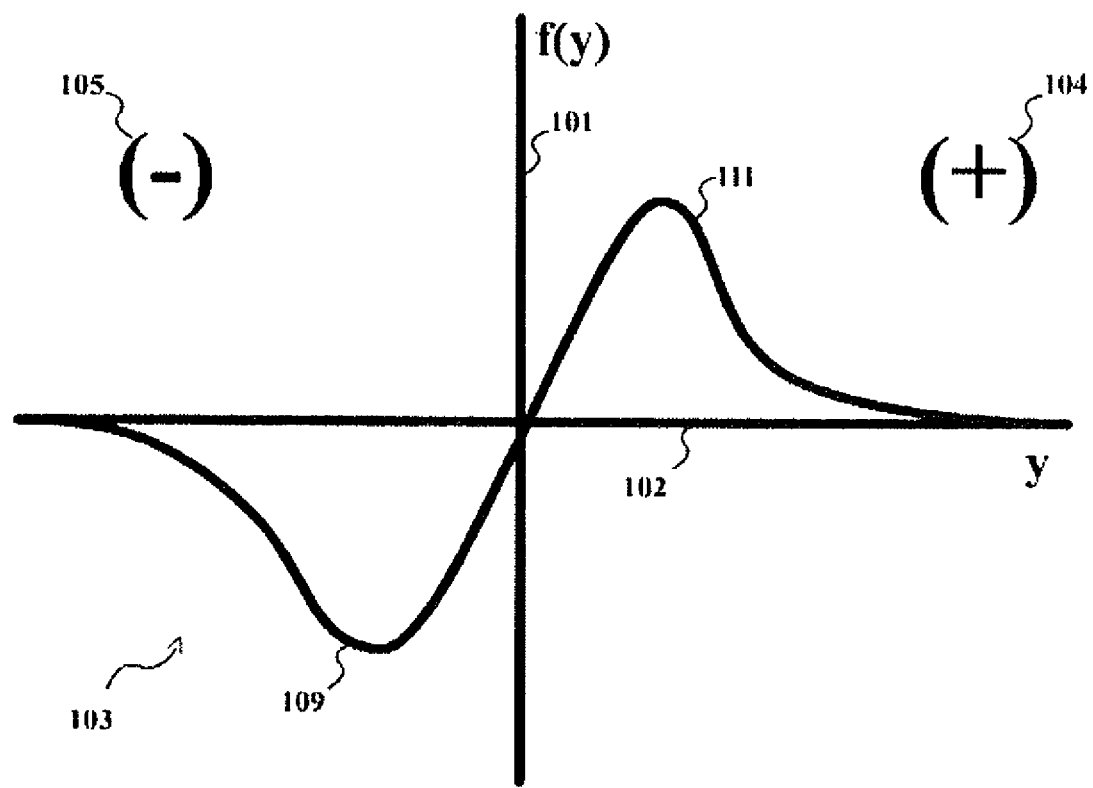
FIG. 1 illustrates a graphical representation of a plasticity rule, which can be implemented in accordance with an embodiment.

The particular values and configurations discussed in these non-limiting examples can be varied and are cited merely to illustrate one or more embodiments.

Dielectrophoresis (DEP)

When a particle is suspended in a solution and subjected to an electric field, the electric field induces a polarization in the particle. If the field is homogeneous, the induced dipole aligns in the direction of the field. If the field is inhomogeneous, the particle will experience a force. The direction of the force is determined by the dielectric properties of the particle and suspension. If the particle is more polarizable than the surrounding medium, the particle will feel a force in the direction of increasing field gradient, which is termed Positive DEP. On the other hand, negative DEP results when the medium is more polarizable than the particle.

At low frequencies, charge accumulation at the particle/medium boundary contributes to the induced dipole, which is referred to as the Maxwell-Wagner interfacial polarization and is a function of the particle and medium conductivity. As the frequency is increased, this term of the polarization has increasingly less of an effect, as the mobile charges do not have time to move an appreciable distance. For the case of a spherical particle, the time-averaged DEP force can be provided by equation (1) as indicated below:

$$\vec{F}_{dep} = 2\pi r^3 \varepsilon_0 \varepsilon_m \text{Re}\left[\frac{\varepsilon_p^* - \varepsilon_m^*}{\varepsilon_p^* + 2\varepsilon_m^*}\right] \nabla E^2 \quad (1)$$

For any geometry other than a sphere or ellipsoid, calculating the DEP force is not trivial, and the applicability of equation 1 requires the particle radius to be small compared to the changes in the gradient of the energy density ($\nabla E^2$).

A conducting particle in a non-conducting liquid or gel will generally feel an attractive force toward the direction of increasing electric energy density. As the frequency of the applied electric field is increased, the force transitions from an attractive to a repulsive force. Although it is possible to use lower frequencies to attract a particle and higher frequencies to repel in such a way as to build and break nanoconnections, in the present disclosure we utilize a lower frequency, attractive force, to build connections and increasing entropy to break connections.

Our basic requirement, which is detailed in this disclosure, is simply that an attractive force be applied to the particle, bringing it in contact with electrodes and bridging an electrode gap. As long as the application of the field gradient results in an increased probability of connection formation, our requirements are met. Indeed, this is the case and has been demonstrated experimentally by a number of independent organizations.

A cross bar architecture is one where nanotubes cross each other in a grid. There are well-defined "off" and "on" states: the "off" states are present where the upper and lower nanotubes at the grid intersections are not connected and the "on" state is present when the two are pulled together. Because of nanotube chemical properties, the nanotubes possess two stable states. The separation (off state) allows a minimum for potential energy. There is also a minimum (on state) when the two are brought together—this is due to the Van der Waals forces that maintain the two nanotubes together. Thus, we can switch back and forth between these states resulting in meta-stability.

Key challenges in this architecture include fabrication and fault tolerance, where the first challenge leads to a solution that in turn leads to the second challenge. In other words, fabrication of millions of individual nanowires on the surface of a chip requires a method for reliably placing the nanowires on the chip. The method is likely to result in fabrication errors, which leads to the problem of how one might build a system out of components that are unreliable. In addition, it cannot be expected that a nano-scale switching element will behave in a reliable manner, even if it is placed perfectly during fabrication.

The Plasticity Rule

Referring now to FIG. 1, illustrated a graph 100, which demonstrates a plasticity rule, which upon one or more embodiments can be based. Graph 100 generally depicts a curve 103 plotted with respect to an axis 101 and an axis 102. Axis 101 generally represents $f(y)$ while axis 102 represents the variable "y" (i.e., y-data). Thus, graph 100 illustrates a plot of y data versus $f(y)$. Two different states 105 and 104 are also indicated in graph 100, where state 105 is a "negative" state or condition and state 104 is a "positive" state or condition. Thus, a portion 109 of curve 103 is associated with state 105, while a portion 111 of curve 103 is associated with state 104. Curve 103 can be generated based on a plasticity rule. The following plasticity rule as indicated by equation (2) below, when applied to the weights of a neuron under the influence of a data stream, has been shown to extract the independent components of the data stream:

$$w_{t+1} = w_t + lxf(y) \quad (2)$$

In equation (2) above, the variable l represents a small positive constant (learning rate), while $f(y)$ represents a non-linear function of the total activation of the neuron, $y = \vec{W}\vec{x}$, where $\vec{W}$ is a weight vector and $\vec{x}$ an input vector. In the implementation of this rule in a physical neural network, $\vec{W}$ represents a matrix of Knowm™ synapses, $\vec{x}$ is applied via voltage pulses, and y is the total activation from the synapses. The variable l, the learning rate, is controlled by a combination of solution viscosity, temperature and operating voltage, and possibly other factors effecting the physical movement of nanoparticles in a liquid or gel solution.

There are many mathematical rules that have been found to extract independent components. For a physical embodiment, it is necessary to find a rule that can be emulated through device physics and/or particle interactions. Equation (2) satisfies such criteria and in fact represents a very natural condition that can be implemented in a variety of media. The embodiments disclosed herein generally discuss how such a rule can be mapped to physical processes and controlled electronically. To understand this mapping, it is necessary to discuss a theory used to describe an unreliable, two-state connection, which has been termed Plastic Probability Theory (PPT). PPT is a way of describing the evolution of discrete-state connections or synapses via applied plasticity rules.

Discrete-State Synapses

Consider a synapse composed of a discrete number of conducting channels, where each channel can be in an "on" or an "off" state. Further consider a plasticity rule capable of modification to the number of conducting channels. We will refer to a conducting channel as open and a non-conducting channel as closed.

The probability at any given time increment that a channel will go from closed to open is considered negligible outside the influence of plasticity. This can be understood, in the light of a Knowm™ Connection or a nanowire cross junction. In terms of a Knowm™ connection, the connection is formed from a plurality of nanoparticles in a liquid suspension. The increase in entropy provides for a high probability that the nanowires, which were attracted to the electrode gap via dipole-induced forces, will be moved to a location other than the gap. In addition, the probability that a connection will form outside the influence of an attractive force is negligible, so we may treat the probability of channel closing and opening as independent. In terms of a nanowire cross junction, the stable ground state is in the non-conducting state, as the mechanical strain requires the nanowire to eventually overwhelm the probabilistic quantum force of Van der Waals interaction.

The probability that a connection will go from conducting to non-conducting is therefore the probability that a channel will close, or even more accurately as the probability the mechanical strain will overcome the Van der Waals interaction. It is clear that the probability of channel closing is independent of the probability of channel opening, and that the probability of channel opening is solely due to plasticity, or in this case an electric field being applied to the system.

In terms of a switching molecule, a meta-stable molecular state causes the transition to the ground state via quantum probability or thermal-induced bombardment. In the case of the switch molecule, is clear that the ground state need not be the non-conducting state. The probability that the molecule will transition from the meta-stable state is due primarily to the addition of plasticity, or more accurately by the addition of an electric field generated between the pre- and post-synaptic electrode. In the case of the switching molecule, it is possible that the molecule may make a transition from the meta-stable to the ground state without the addition of plasticity. In this case, it is required that this transistor is simply less probable.

The probability that a channel will go from open to closed at any given time increment is given by a function, E(T), which can be attributed to random thermal motion or spontaneous transitions and is primarily a function of temperature.

Given a total of No open channels, out of N total channels, the update to the connection can be given as the difference between the plastic update, P, and the thermal breakdown, B. The plastic update and the thermal breakdown are dependant on the number of open channels. However, the plastic update can only act on closed channels. In other words, a channel, once opened, can only be closed. If it is open, the probability of closing is given by E(T) as indicated in equations (3) below:

$$B = NoE(T)$$

$$P = (N-No) \cdot H(No)$$

$$\Delta No = P - B = (N-No) \cdot H(No) - NoE(T) \quad (3)$$

In equations (3) indicated above, H(No) represents a Plasticity Probability Field (PPF), which will be discussed shortly. The stable points of equations (3) occur when the plastic update equals the thermal breakdown. Solving for the PPF we have:

$$H(No) = \frac{NoE(T)}{N - No} \quad (4)$$

For a given thermal breakdown probability, E(T), equation (4) provides the minimum Instantaneous Probability (IP) necessary to oppose the thermal breakdown. An IP less than that given by equation (4) can result in the loss of open channels. An IP greater than equation (4) can result in a gain of open channels. To find the stable points a specific PPF should be selected. Consider the following PPF provided by equation (5):

$$H(No) = \alpha No e^{-\frac{No^2}{2\sigma^2}} \quad (5)$$

For a given No, equation (5) provides the IP that a closed channel will open. If equations (4) and (5) are graphed, their intersection represents the equilibrium number of open channels, No.

Plastic Probability Fields

Consider a Knowm™ synapse. The dielectrophoretic force causes the aggregation of nanoparticles to areas of high field gradient. This leads to nanowires bridging the electrode gap formed from pre- and post-synaptic electrodes. If the particles are conducting, the local electric field breaks down, which inhibits the growth of neighboring wires. This results in a set number of possible connections. Without thermal breakdown, i.e. the force of random thermal collisions, the wires would remain indefinitely and eventually reach the maximum possible, N. Under the influence of thermal breakdown, however, the connection will not reach the maximum number of channels, but instead achieves a balance between thermal degradation and plastic updates.

Figure 21:
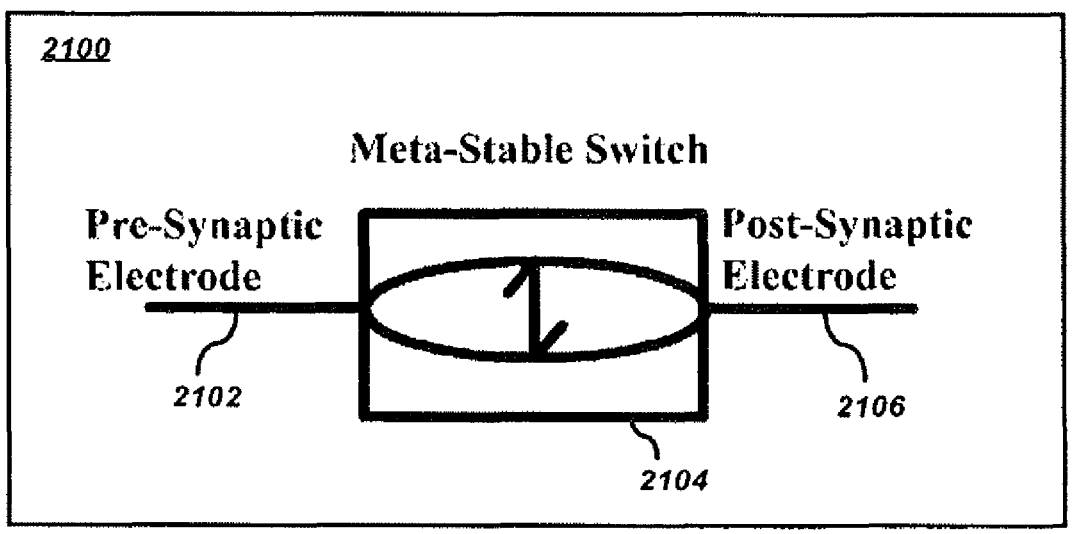
FIG. 21 illustrates a block diagram of a meta-stable switch, which can be implemented in accordance with an embodiment.

In addition, consider nanowire cross junction array architecture. The probability that a closed channel will open is related to the difference between pre- and post-synaptic nanowire electrode voltages. As the device dimensions shrink and the nanowire supports become closer, the bistable switch becomes a meta-stable switch. FIG. 21, for example, illustrates a block diagram of a system 2100 composed of a meta-stable switch 2104, which can be implemented in accordance with an embodiment. In the example depicted in FIG. 21, the meta-stable switch is disposed between at least one pre-synaptic electrode 2102 and at least one post-synaptic electrode 2106. Indeed, as the operating voltage is reduced, the "configuration" voltage becomes comparable to the "read-out" voltage. As the read-out voltage has the potential to unlatch the cross-junction, the act of reading the junction state increases the probability of junction failure. As the support become closer, there is a relatively high probability that the switch will make a spontaneous transition from the meta-stable to the stable state. When this occurs, the same principles and circuitry discussed for the Knowm™ synapses can be applied to a cross bar architecture.

Figure 23:
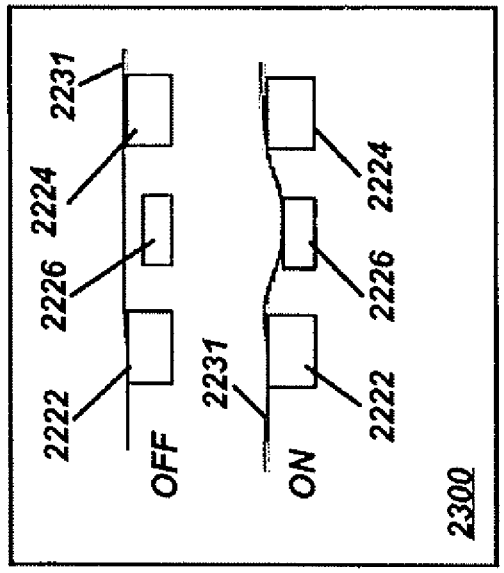
FIG. 23 illustrates a side view of the cross bar architecture depicted in FIG. 22 in accordance with one embodiment.
Figure 22:
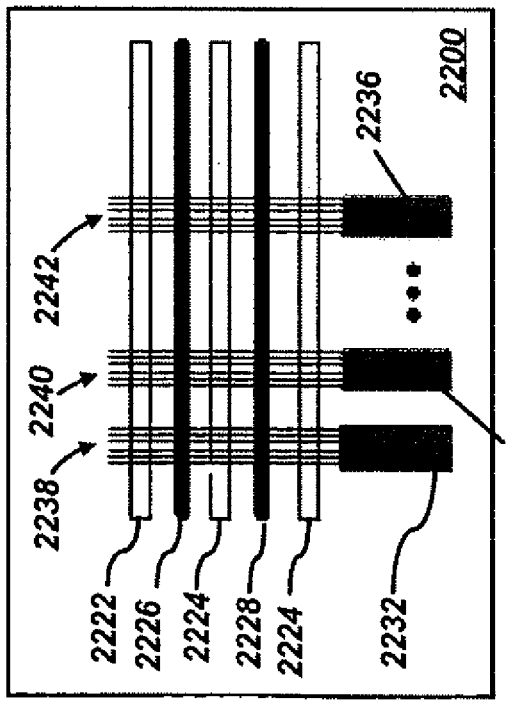
FIG. 22 illustrates a top view of a cross bar architecture, which can be implemented in accordance with one embodiment.

FIG. 22 illustrates a top view of a system 2200 that can implement such a cross bar architecture in accordance with one embodiment. FIG. 23 illustrates a side view of the cross bar architecture of system 2200 depicted in FIG. 22 in accordance with one embodiment. In general, system 2200 generally includes a plurality of electrodes 2222, 2224, 2226, 2228, and 2230 arranged in a cross bar architecture. Pre-synaptic electrodes 2224 and 2228 may potentially contact post-synaptic electrodes, configured in association with a plurality of nanowires 2238, 2240 and 2242. Post-synaptic electrodes 2238, 2240 and 2242 may be contacted electrically via electrode 2232, 2234 and 2236. It can be seen from FIG. 22 that each post-synaptic electrode may be configured as a plurality of nanowires, where each nanowire is capable of one mechanical stress contact, as indicated in FIG. 23.

Supports 2222, 2226 and 2230 raise nanowire 2231 above pre-synaptic electrode 2224. The application of a voltage gradient across pre- and post-synaptic electrode leads to a non-zero probability that a nanowire 2231 will transition from the OFF state to the ON state. In addition, the application of a voltage to the junction in the ON state will lead to a non-zero probability that nanowire 2231 will transition from the ON state to the OFF state. The application of pre- and post-synaptic voltage pulses, as outlined in this disclosure, leads to a reliable synaptic junction suitable for object recognition and universal logic function.

In addition, consider a switching molecule architecture. The probability that a closed channel will open is related to the difference between pre- and post-synaptic electrode voltages, as these voltage create an electric field that may switch the molecule into a conducting state. Alternatively, the notions of closed and open are arbitrary in a two-state system, so the application of an electric field via applied pre- and post-synaptic voltage may cause an increase probability of transition into a non-conducting state. When either of these two situations occurs, the same principles and circuitry discussed for the Knowm™ synapses can be applied to the switching molecule architecture.

Figure 25:
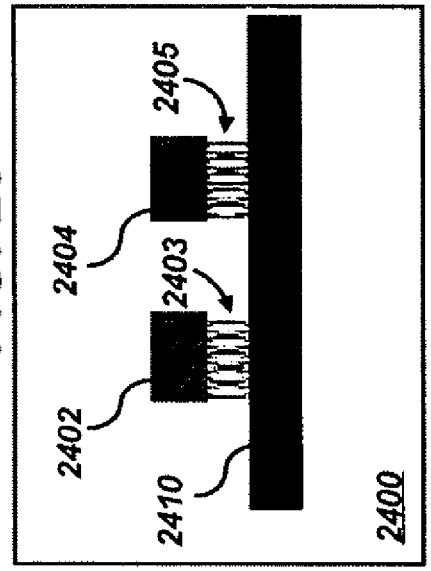
FIG. 25 illustrates a side view of the switching molecule architecture depicted in FIG. 24, in accordance with another embodiment.
Figure 24:
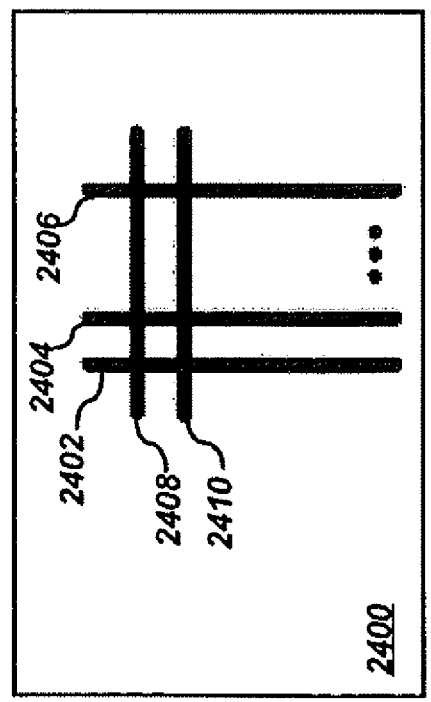
FIG. 24 illustrates a top view of a switching molecule architecture, which can be implemented in accordance with another embodiment.

FIG. 24 illustrates a top view of a system 2400, which can implement a switching molecule architecture, in accordance with another embodiment. FIG. 25 illustrates a side view of the switching molecule architecture system 2400 depicted in FIG. 24. Pre-synaptic electrodes 2408 and 2410, composed of an electrical conducting material, are placed perpendicular, either under or above, post-synaptic electrodes 2402, 2404 and 2406. Switching molecule junctions 2403 and 2405 are located between pre- and post-synaptic electrodes, as indicated in FIG. 25. The application of a voltage gradient across pre- and post-synaptic electrodes leads to a non-zero probability that the plurality of switching molecules 2403 and 2405 will transition from the OFF state to the ON state. In addition, the application of a voltage to the junction in the ON state will lead to a non-zero probability that the plurality of switching molecules 2403 and 2405 will transition from the ON state to the OFF state. The application of pre- and post-synaptic voltage pulses, as outlined in this disclosure, leads to a reliable synaptic junction suitable for object recognition and universal logic function.

A Plastic Probability Field (PPF) is a function that provides the probability that a channel will move from a closed state to an open state over a particular increment of time. The reason the PPF function is a field instead of just a single value is that this probability can (and should) change as a function of the post-synaptic activation. In addition, a PPF does not obey most of the usual notions of probability functions, like normalization and a continuous derivative. The only functional requirement is that the PPF never attain a value greater than 1 or less than zero.

As an example, suppose a connection is composed of N=10 channels. At time step t, 5 of the channels are open (No=5). If the PPF is given as $$H(No) = \frac{1}{10} No$$

then there will be a 50% probability that each of the closed channels will open. In the absence of thermal break down, we would therefore expect about 7 or 8 channels to be open at time step 6. If the probability of breakdown was $P_f=0.5$, then on average no new channels would form and the connection will have reached a stable state.

Implementation of Equation (2) as a Plastic Probability Field

Equation (1) includes two basic features that should be taken into account in the physical implementation. First, as the magnitude of the activation becomes large, the update to the connection becomes negligible. Second, it is required that the update rule be capable of re-enforcing two separate states, which can be referred to as the (+) state and (−) state, or State 1 and State 2, respectively. Examples of such variations in state are illustrated in FIG. 1, with respect to states 104 and 105. In FIG. 1, each state 104 and 105 represents one side of zero. To aid in understanding of the embodiments disclosed herein, however, it may help to realize that positive and negative are simply two distinct states, such as A and B or "On" and "Off". In other words a connection can be treated as possessing at least two aspects: a magnitude and a state.

The form of the plasticity rule implemented herein requires a multiplication of the form: $\vec{W}\vec{x}$ and $x \cdot f(y)$. The input, x, can be implemented in the form of binary voltages, on and off or "1" and "0". In general, On can represent an electrode that has been raised to the supply voltage. Off can represent an electrode that has been grounded. Alternately, and perhaps more clearly these states can be referred to as (+) and (−), or, for example, simply State 1 and State 2. Likewise, y is also the result of a series of explicit multiplications as indicated by equation (6) below:

$$y = w_1 x_1 + w_2 x_2 + w_3 x_3 + \ldots + w_n x_n = \vec{W}\vec{x} \tag{6}$$

The rules of multiplication, when dealing with numbers of complimentary states can be represented by the following group of equations (7):

$$A(-B) = (-A)B = -AB$$

$$AB = BA$$

$$(-A)(-B) = AB \tag{7}$$

For a Knowm™ implementation of equation (2), each Knowm™ synapse should preferably possesses a distinct state, and should effectively multiply itself with the input state. In addition, the update to the neuron should follow the rules of multiplication as well: If the output of the neuron falls in the (+) state, for example, then the connection needs to be modified in such a way to enforce the connections ability to transform the current input state to the current output state. This can be accomplished by multiplication with the input and can be provided, for example, in the form of a feedback mechanism that applies an electric field to attract the particles to the electrode gap, bring nanowire cross junction together, or transition a molecule from a non-conducting to a conducting state, or the absence of an electric field so increasing entropy may weaken a Knowm™ connection, mechanical strain may return a nanowire cross junction to its ground state, or a switching molecule may return to its ground state via spontaneous transition or reverse voltage bias.

For the case of a Knowm™ synapse, if under the frequency spectrum of the applied electric fields the particle feels a positive DEP force, then this force is proportional to the square of the energy density, as provided by equation (1). This can alternately be represented by a pre- and post-synaptic voltage, as indicated by equation (8) below:

$$\nabla|E| = \nabla|V_{pre} - V_{post}|^2 \tag{8}$$

The exact positions of every particle, as well as all of the forces applied to it, are not known. A computationally tractable model must consider time-averaged approximations. Random thermal motion seeks to disperse the particles through the solution. The application of a voltage difference will increase the probability that a particle will bridge the gap between pre- and post-synaptic electrodes. As a first approximation, we may treat the instantaneous probability that a connection will form, or a conduction channel will open, as proportional to the square of the voltage difference between pre- and post-synaptic electrodes. The accumulation of probability is proportional to the integral of pre- and post-synaptic voltages over one evaluate/feedback cycle, a cycle that will be discussed shortly.

As an alternate embodiment, the force responsible for nanowire cross junction contact is given by the sum total of electromagnetic forces between the two nanotubes minus the mechanical strain from nanowire bending. When the electromagnetic force, which is of course related to the difference of pre- and post-synaptic voltage, overcomes the mechanical strain, the nanowires come in contact and the channel is opened. Thus the accumulation of probability is proportional to the integral of pre- and post-synaptic voltages over one evaluate/feedback cycle, a cycle that will be discussed shortly.

As yet another alternate embodiment, the force responsible for the transition of a conducting to a non-conducting, a non-conducting to a conducting state, or a ground state to a meta-stable state, is a result of the electric field between the pre- and post-synaptic electrode, which of course is related to the difference between pre- and post-synaptic electrode voltages. Thus the accumulation of probability is proportional to the integral of pre- and post-synaptic voltages over one evaluate/feedback cycle, a cycle that will now be discussed.

It can be seen that this basic process of a state transfer can occur in many forms, and in all forms, the transition from one state to the other is aided by the presence of an electric field, which is generated by the accumulation or absence of charge on pre- and post-synaptic electrodes. The accumulation of probability of a channel opening is proportional to the integral of the pre- and post-synaptic voltages over one evaluate/feedback cycle.

Evaluate-Feedback Cycle

Consider one Knowm™ Connection, formed between pre-synaptic electrode "A" and post-synaptic electrode "B". Given the inherently unstable nature of the connection in a liquid, we must provide a mechanism to stabilize the connection at a particular value while simultaneously monitoring the connection strength. Once the connection is at the desired strength, we must either continually provide the feedback mechanism to keep the connection stable, or else freeze the solution so as to prevent thermal breakdown. As previously discussed, the application of an activity-dependant plasticity rule can be utilized as a mechanism for setting or designating connection strengths or states. Such a plasticity rule, as applied to a Knowm™ connection, preferably operates on pre- and post-synaptic voltages.

To compute a post-synaptic activation, one must "evaluate" the connections. That is, a particular input vector must be applied to pre-synaptic electrodes and the post-synaptic electrode must integrate the individual contribution to form the post-synaptic activation. This activation should produce a post-synaptic voltage. The post-synaptic voltage can then be utilized to apply the desired plasticity rule. To accomplish this, the evaluate phase can be separated from the feedback phase. The evaluate and feedback phases may further be divided, so as to provide for correct initial conditions.

We will assume initial conditions are correctly set, i.e. pre- and post-synaptic voltages are preferably set to starting values. The accumulated probability over both the evaluate and feedback phase is generally responsible for the connection update. By separating the process into two phases, we acquire the two behaviors necessary for a successful integration of equation (2). The decreasing update as a function of activity is provided through the "evaluate" phase while the correct update sign is accomplished with the feedback phase. To demonstrate such a functionality, consider a simple Knowm-Capacitor circuit 200, as illustrated by FIG. 2.

Figure 2:
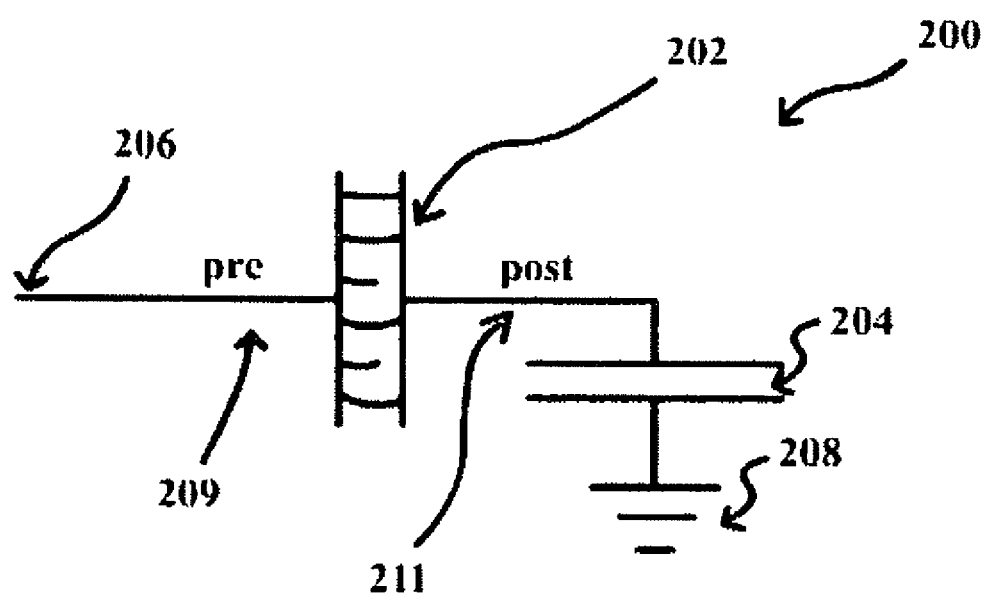
FIG. 2 illustrates a Knowm-Capacitor circuit, which can be implemented in accordance with one embodiment.

In general, the Knowm-Capacitor circuit 200 depicted in FIG. 2 includes a Knowm™ connection 202 disposed between a pre-synaptic input 209 and post-synaptic output 202 thereof. Note that the Knowm-Capacitor circuit 200 is connected to a capacitor 204 at the post-synaptic output 202. Capacitor 204 is in turn connected to a ground 208. The Knowm™ connection 202 can be thought of as constituting an electro-kinetic induced particle chain. The configuration of circuit 200 is presented herein for illustrative and exemplary purposes only. Because the nanowire cross junction and switching molecules have the same general voltage dependencies as a Knowm™ synapse, one just needs to replace the Knowm™ connection with another form of a meta-stable nanoscale switch. It can be appreciated that variations to circuit 200 can be implemented, while still maintaining the spirit and scope of the embodiments disclosed herein.

At a time t=0, both pre- and post-synaptic voltages are set to zero. If the pre-synaptic input 209 is raised to a positive value, then the post-synaptic voltage at the post-synaptic output 211 will begin to rise at a rate determined by the number of open channels. The more open channels, the faster the post-synaptic voltage at the post-synaptic output 211 will equilibrate with the pre-synaptic voltage. Recall that the update to the meta-stable switch, as given by a probability that a closed conducting channel will open, is given by the accumulation of probability, which is related to the integral of the voltage difference across the pre- and post-synaptic electrode. If we only consider the evaluate phase, then it is apparent that as the meta-stable connection 202 grows stronger, and the activity increases, the accumulated probability becomes smaller and approaches zero.

If, for instance, a series of input voltage pulses is applied at the pre-synaptic input 209, then the meta-stable switch 202 would equilibrate to a value proportional to total pre-synaptic activation. This could prove a valuable electronic filter. As it stands, the feedback mechanism would not mirror the desired plasticity rule. The connection possesses a resistance somewhere between a minimum intrinsic resistance (maximum particles bridging gap, nanowire cross junctions closed, or conducting states of molecular switches) and a maximum intrinsic resistance (no particles bridging gap, no nanowire cross junctions open, or no non-conducting molecular switch states). To build a system capable of 4-quadrant synaptic multiplication, there are 3 basic electrode arrangements. In each arrangement, there also exists more than one feedback mechanism capable of emulating the plasticity rule. We will discuss these three electrode arrangements, as well as the various feedback circuitry necessary to provide the required feedback. In all cases, a feedback phase is required, in addition to the evaluate phase, to insure proper connection modification. However, to understand the feedback stage, it is necessary to discuss a two-state meta-stable switch.

Figure 3A:
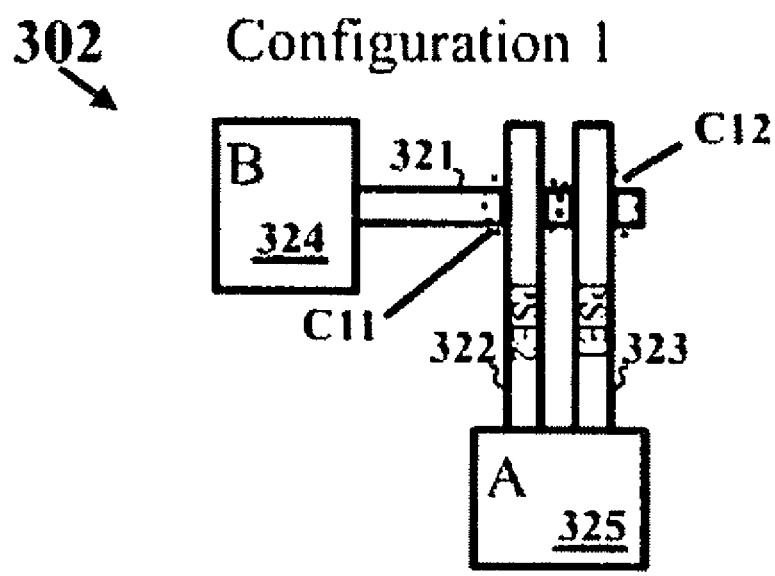
FIGS. 3(a)-3(d) illustrate circuit layout configurations, which can be implemented in accordance with one or more embodiments.

A meta-stable switch, in the configurations discussed herein, does not inherently posses two states, it is necessary to build the two states into the circuitry. One can understand this by the fact that a metastable switch, on its own, cannot multiply the state of an input signal. We can create a two-state meta-stable synapse by combining two or more meta-stable switches. Take for instance the case of one pre-synaptic electrode and two post-synaptic electrodes, an arrangement that can be referred to as configuration 1, which is depicted in FIG. 3(a), for example, as circuit layout 302.

FIGS. 3(a)-3(d) illustrate circuit layout configurations 302, 301, and 303, which can be implemented in accordance with one or more embodiments. Layout 302 of configuration 1 depicted in FIG. 3(a), for example, generally includes an A circuit 325 and a B circuit 324. An electrode 321 is connected to B circuit 324, while electrodes 322 and 323 are connected to A circuit 325. Electrode 322 can constitute a post-synaptic electrode 1 (PSE1), while electrode 323 can constitute a post-synaptic electrode 2 (PSE2).

The PSE1 322 can be arbitrarily assigned to State 1, while PSE2 323 is arbitrarily assigned to State 2. During the evaluate phase, the post-Synaptic electrode with the higher voltage is considered the "winner" and feedback circuitry (i.e., to be discussed herein) saturates the voltages. We may view the meta-stable switch connecting the input to the PSE 1 322 as C11 and the connection between the input and PSE 2 323 as C12.

The pre-synaptic voltage may be used to encode the state of the input. A positive voltage may arbitrarily be assigned to state 1 and a zero voltage to state 2. If, during the evaluate phase, the pre-synaptic input is positive, then the synapse connecting the input to PSE1 and PSE2 (remember that each synapse is now represented by two meta-stable switches) is considered to be positive if the connection facilitates the transfer of an input in state 1 to a post-synaptic output in state 1. Likewise, if the input is in state 2, then the connection is considered positive if the connection facilitates the transfer of the post-synaptic output to state 2. This is simply a restatement of the rules of multiplication, as outlined in equation 6. The following Table 1 illustrates these features:

TABLE 1

| Pre-Synaptic State | Post-Synaptic State | Connection state |
|---|---|---|
| 1 | 1 | 1 |
| 1 | 2 | 2 |
| 2 | 2 | 1 |
| 2 | 1 | 2 |

A synapse may not necessarily facilitate the transfer of the pre-synaptic state to the post-synaptic state. In this case, the post-synaptic state was determined by the summation of individual activations from all other synapses. If a synapse state is in conflict with the transfer of the pre-synaptic state to the post-synaptic state, then according to the above mentioned plasticity rule, the connection should be modified in a direction opposite its current state.

For electrode configuration 1 of circuit layout 302, if C12 was a strong connection (i.e., one with many conducting channels) and C11 was weak, then the connection could be considered to be in State 2. This is because an input in state 1 (i.e., a positive input voltage) would maximally affect PSE2, raising its voltage at a larger rate than C11 could raise PSE1. Correspondingly, an input in state 2 (zero input voltage) would maximally affect PSE1 because PSE2 would receive a stronger pull to ground. The PSE1 voltage would consequently be higher, forcing the neuron into state 1. Thus we have the case that a connection with C12>C11 facilitates the state transfers: 1→2 and 2→1. This is consistence with a connection in state 2. One can demonstrate with the same arguments that a synapse with C11>C12 is consistent with a connection in state 1.

We may now consider the overall synaptic update as a function of post-synaptic activation on PSE1 and PSE2, and show that the functional form matches that required by the above mentioned plasticity rule. For illustrative purposes, consider the case of a synapse in state 1 under inputs from both state 1 and state 2. Note that we must consider the updates to both C11 and C12, as it is only their relative strengths that determine the sign of the connection. The update to the synapse can be given as indicated by equation (9) below:

$$\Delta W = N_C((A_{C11}) - (A_{C12} - A_E)) \quad (9)$$

As indicated by equation (9), the variable $A_{C11}$ represents the accumulation of connection formation probability on C11 and $A_E$ is the (negative) accumulation due to random thermal motion or spontaneous state transitions. Note that because a differential pair represents the connection, the negative accumulation due to random thermal motion or spontaneous state transitions cancels out. Also note that when C11 equals C12 (if we consider a neuron with only one input, otherwise the activation is a function of all synapses), the accumulation on C11 cancels the accumulation on C12 and the update is zero. Likewise, if C11>>C12 or C12>>C11, the accumulation for C11 equals the accumulation for C12 and again the accumulation cancels out, resulting in zero overall update. This last statement can only be understood if one considers an entire evaluate/feedback cycle. The specific characteristics of the feedback cycle will be discussed shortly.

One important detail should be mentioned. Although the negative accumulation due to random thermal motion or spontaneous state transitions cancels out in equation (9), this does not mean that the individual connection has not received the negative accumulation. The accumulation from plastic updates cancels the accumulation from random thermal motion and/or spontaneous state transitions. Even without an explicit plastic update, a residual accumulation is needed to keep the plastic update probability at a value sufficient to oppose thermal breakdown. Otherwise a meta-stable switch would have very little chance of remaining in its meta-stable state. We provide this residual force, and control it, by setting the periods of the evaluate and feedback phase. For example, by doubling the period of the evaluate and feedback phase, we double the probability that the switch will transition to the meta-stable state.

A similar result can also be achieved by increasing the supply voltage, while maintaining the same evaluate and feedback periods. This could be advantageous because increasing the period will increase the time of computation, at the cost of increase power dissipation. More aspects of the rule may be controlled electronically by varying the ratio of evaluate and feedback periods. For example, by increasing the feedback phase while maintaining the evaluate phase, the effective "width" of the rule can be narrowed. Such an operation in turn allows the rule to better separate closely adjacent features in the input data space.

It can be appreciated that such electronic control over the plasticity rule is extremely beneficial. The control will allow the same chip to process many different types of data sets, and for the feedback dynamics to be modified on-the-fly to account for variations in parameters such as temperature, processing speed, and input data statistics.

The feedback phase can now be discussed in greater detail. Consider three consecutive inputs, each in State 1, applied to a connection in state 1. Also consider an arbitrary initial synapse value such as C11=100 gΩ and C12=101 gΩ. During the application of the first input during the evaluation phase, PSE1 would receive a slightly higher current flux. This difference will be amplified over the course of the evaluate phase until the post-synaptic output is saturated in state 1, or PSE1=1 and PSE2=0. The relative difference between the current flux on PSE1 and PSE2 determine the time required for the feedback circuitry to saturate the voltages in complimentary states. If the difference is initially minute, it could take the entire evaluate phase. If the initial difference is large, the voltages will saturate very quickly, with plenty of time left in the evaluate phase.

Note that in FIGS. 3(*b*) and 3(*c*), circuit layouts 301 and 303 are also illustrated, which represents variations to the circuit layout 302 or configuration 1. Circuit layout 301 thus represents a configuration 2, which is discussed in greater detail herein, while circuit layout 303 represents a configuration 3. Circuit layout 301 or configuration 2 generally includes a B circuit 314 and an A circuit 315. Electrodes 311 and 312 are connected to B circuit 314, while an electrode 313 is connected to A circuit 315. A meta-stable switch 380 can be formed between electrode 311 and 313. Similarly, a meta-stable switch can be formed between electrode 313 and electrode 312. In circuit layout 303 of configuration 3, a B circuit 335 is provided along with an A circuit 336.

Electrodes 331 and 332 are connected to the B circuit 335, while electrodes 333 and 334 are connected to A circuit 136. A meta-stable switch 390 is generally formed between electrode 331 and electrode 334. Similarly, a meta-stable switch 392 can be formed between electrode 334 and 332. Similar meta-stable switches, although not depicted in FIG. 3(*c*) are generally formed between electrode 331 and electrode 333 and between electrode 332 and electrode 333. A detailed side view 397 of Knowm™ connection 390 is indicated by FIG. 3(*d*). Note that in FIGS. 3(*c*) and 3(*d*), identical or similar parts or elements are generally indicated by identical reference numerals.

Figure 4:
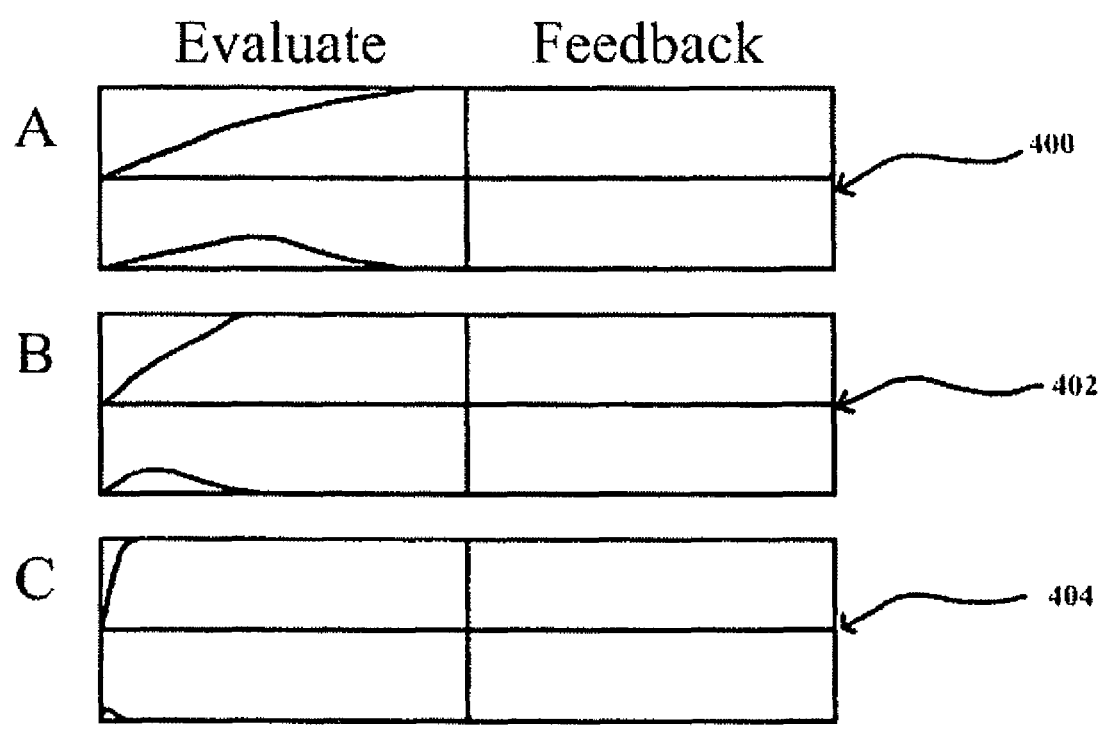
FIG. 4 illustrates evaluate and feedback phase frames, which may be generated in accordance with one or more embodiments.

FIG. 4 illustrates evaluate and feedback phase frames 400, 402 and 404 which may be generated in accordance with one or more embodiments. Frames 400, 402, 404 can also be designated as respective frames A, B, C. Returning to the foregoing example, during the evaluate phase, C12 can receive a larger accumulated probability of connection formation, as depicted by the shaded region in frame A of FIG. 4. During the feedback phase, the pre-synaptic voltage will flip while the feedback circuitry holds PSE1 and PSE2 at their saturated values.

Over the course of the feedback phase, C11 receives a relatively large accumulation while C12 will receive none. When both the evaluate and feedback phases are taken together, C11 receives a slightly larger update. In the next application of the input in state 1, PSE1 will again "win", and a feedback phase will ensure a higher accumulated probability of connection formation on C11 than C12. This time, however, the accumulated probability is slightly less for C11 that it was in the previous frame. The reason is that the increase number of opened channels lowered the resistance on the C11 connection. This causes a higher current flux in the next evaluate cycle.

Although both connections received an update, it is only the difference that matters. As one can see from frames A, B, and C of FIG. 4. as the post-synaptic activation increases, the accumulation returns to a set level comprising equal accumulations for both C11 and C12. As indicated thus far, during the evaluate phase, there is no direct correspondence between the post-synaptic voltage and the force needed to emulate the plasticity rule as discussed above. For example, as the PSE's become more positive, the voltage difference between the pre-synaptic electrode and post-synaptic electrode lessens, the electric field becomes weaker, and the attractive force dissipates. What we require is indeed just the opposite: as the post-synaptic voltage rises, the voltage difference between the pre- and post-synaptic electrodes needs to increase, thereby providing the positive feedback required by our plasticity rule. We will accomplish this by separating the read-out or evaluate phase from the modification or feedback stage.

As the post-synaptic neuron becomes increasingly activated, the probability that the connection grows larger will decrease. We have captured the first aspect of the above mentioned plasticity rule, i.e., as y becomes larger, $f(y)$ must decrease to zero. Without the feedback phase, however, the direction of connection update is incorrect. With only an evaluate phase, the weight that contributes to the final post-synaptic neural state receives a smaller update. If this were to continue for only a small time, all connections would acquire equal values. To change the direction of the update, a simple operation can be performed, i.e., flip the pre-synaptic value and lock the post-synaptic value.

Figure 5:
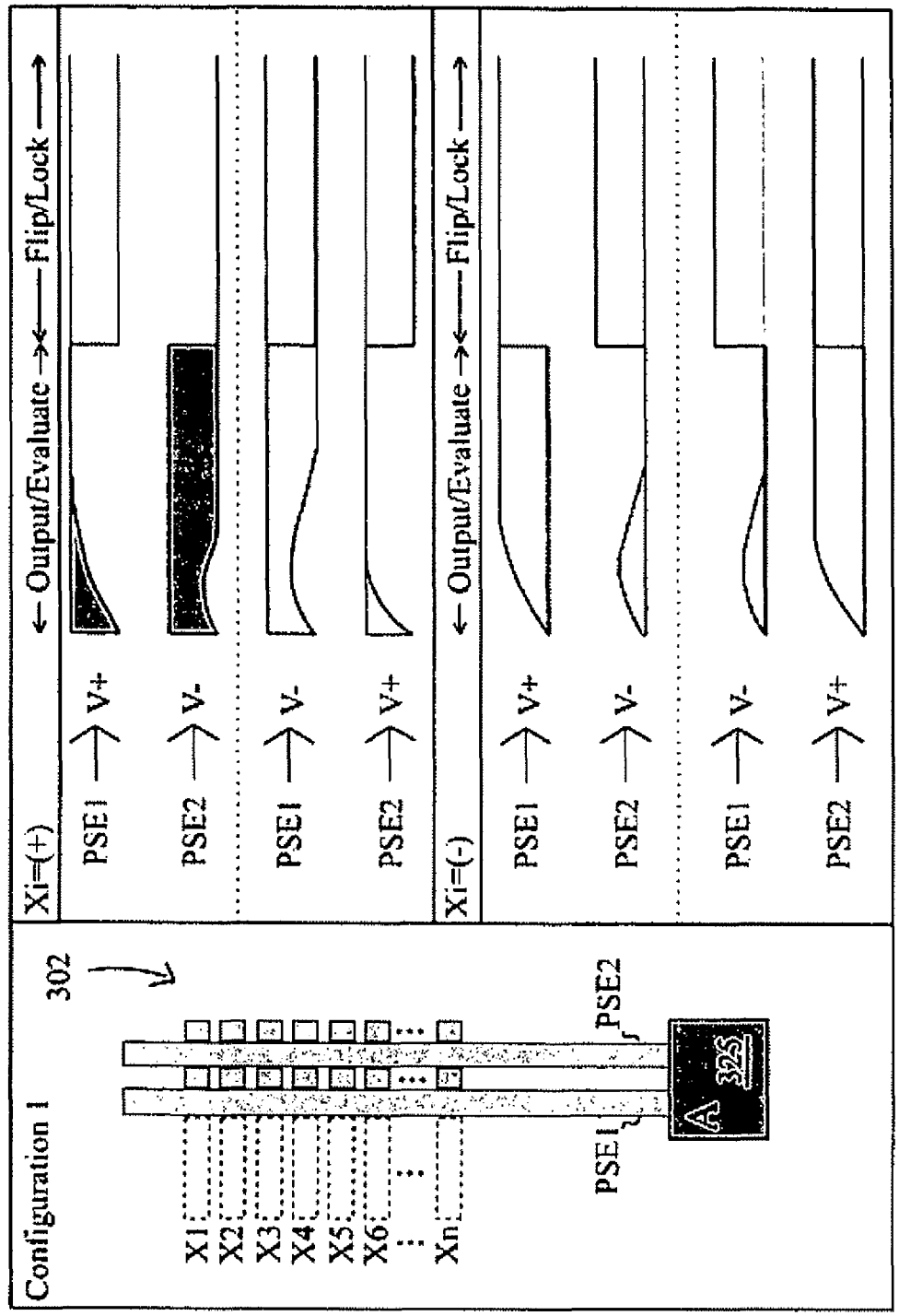
FIG. 5 illustrates output/evaluate and flip/lock phase representations, which can be implemented in accordance with a first circuit layout configuration.
Figure 6:
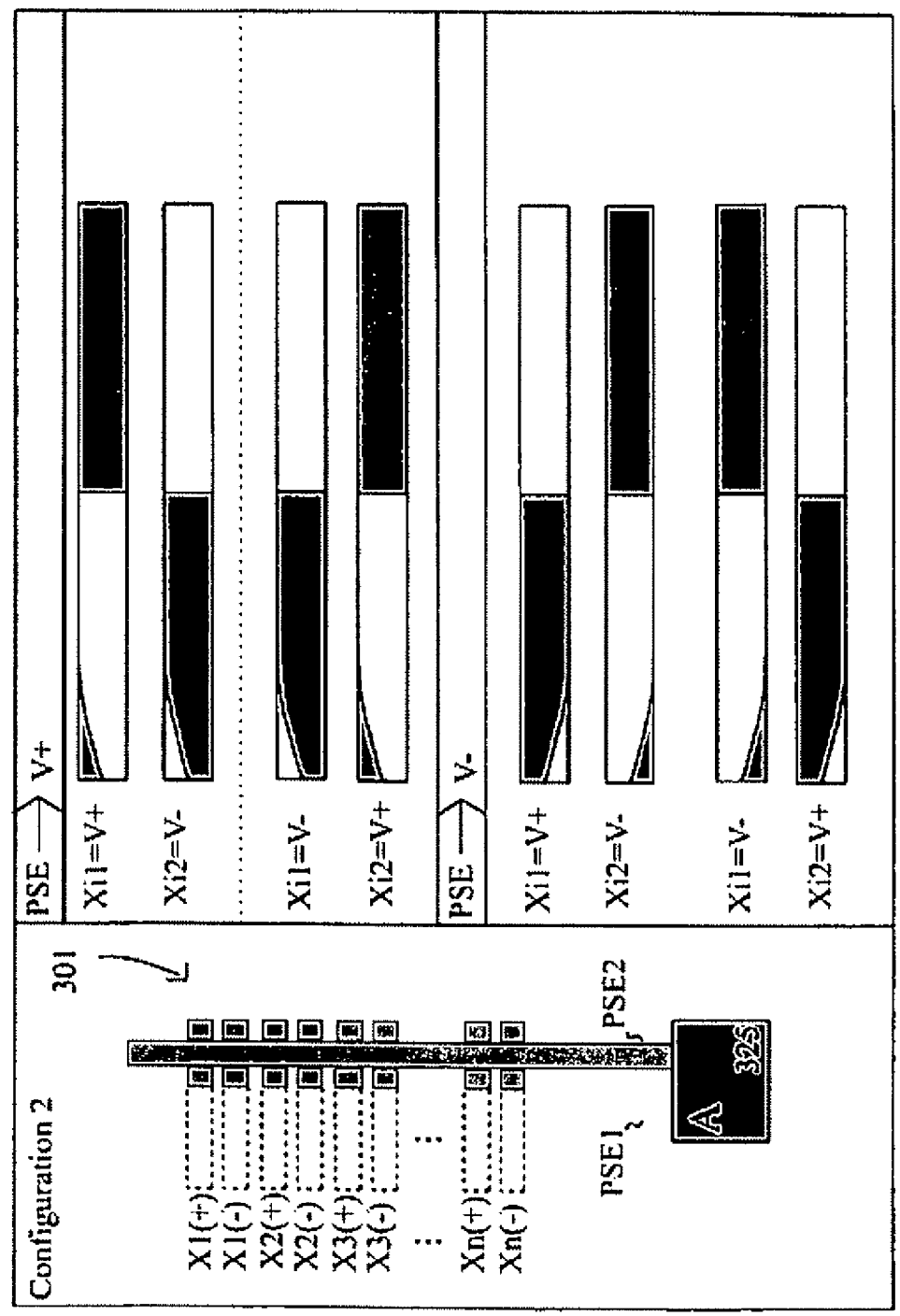
FIG. 6 illustrates output/evaluate and flip/lock phase representations, which can be implemented in accordance with a second circuit layout configuration.
Figure 7:
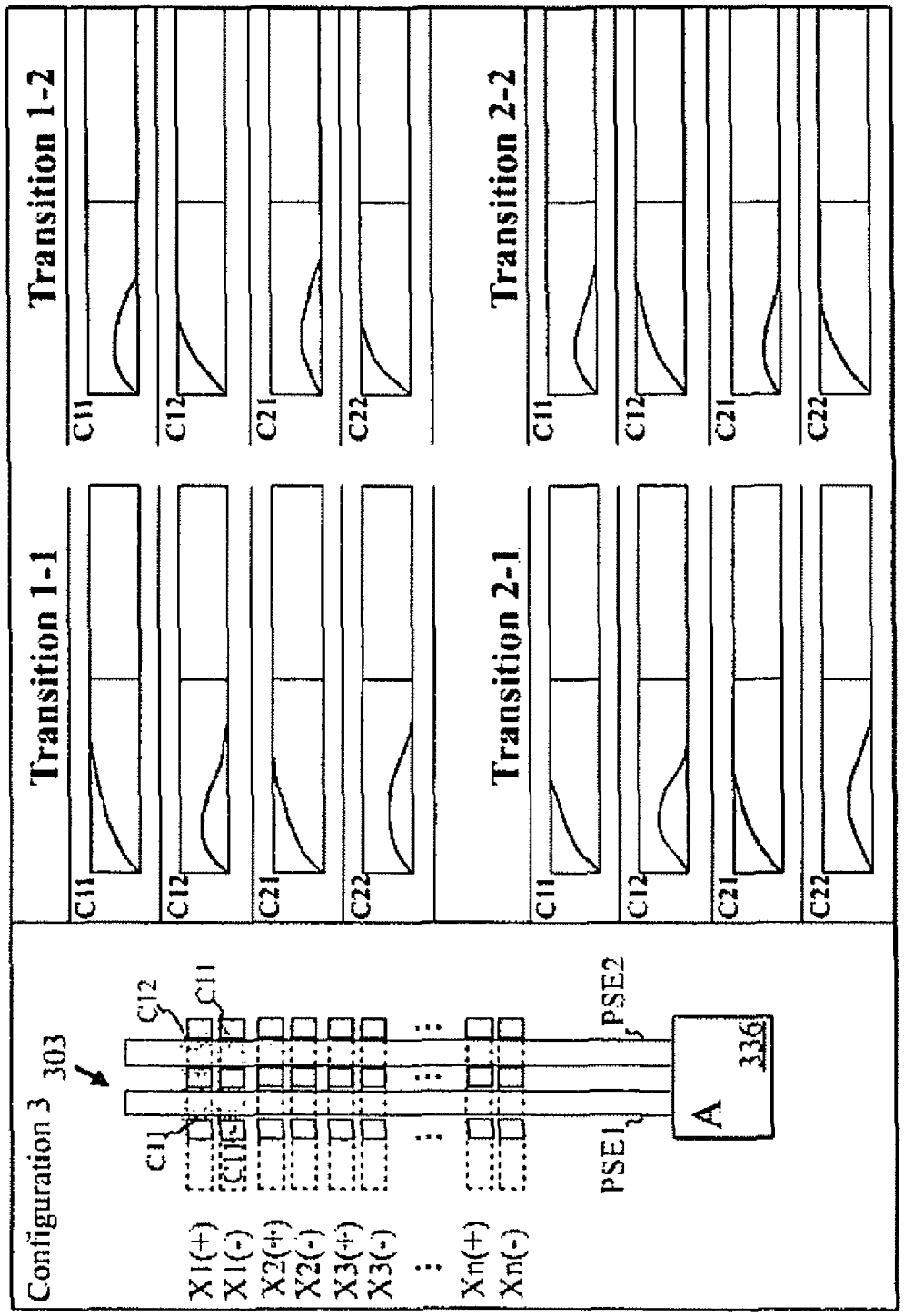
FIG. 7 illustrates output/evaluate and flip/lock phase representations, which can be implemented in accordance with a third circuit layout configuration.

A clock signal cycles the neural circuitry between the evaluate and feedback stage. FIGS. 5, 6 and 7 generally outline or summarize this concept. Note that in FIGS. 3(a)-3(d) and FIGS. 5, 6 and 7, identical or similar parts or elements are generally indicated by identical reference numerals. Circuit layout 302 of configuration 1 is depicted in FIG. 5, for example, along with associated output/evaluate and flip/lock frames. Similar features are depicted in FIGS. 6 and 7 for respective circuit layouts 301 and 303.

During the evaluate phase, the pre-synaptic electrodes are locked into either State 1 or State 2. The pre-synaptic electrodes can be seen as a voltage source driving a signal representative of either State 1 or State 2. We will refer to this as the Output stage, which is the pre-synaptic portion of the Evaluate phase. While the pre-synaptic circuitry is locked in the Output stage, the post-synaptic neural circuitry is locked in the Evaluate stage. In other words, while the pre-synaptic neuron is outputting, the post-synaptic neuron is evaluating. During this phase, the voltages generated by the Output phase of the pre-synaptic neurons are driving the PSE of the post-synaptic neural circuitry.

The post-synaptic neural circuitry provides a feedback mechanism that positively re-enforces the voltages seen on PSE1 and PSE2. In other words, the circuitry forces PSE1 and PSE2 into orthogonal states: if the voltage on PSE1 is initially larger than the voltage on PSE2, the circuitry further accentuates this difference until PSE1 and PSE2 is fully saturated at the supply rails. The circuitry that accomplishes this will be discussed, but is not considered a limiting aspect of the present Invention. Indeed, there exist many circuits capable of this type of positive re-enforcement. At the end of the Evaluate phase, the pre-synaptic neural circuitry flips the Output values state. In other words, if the Output stage was State 1, at the end of the Output phase, the pre-synaptic electrodes are driven to the complimentary state, or state 2. We refer to this as the Flip stage of the Feedback phase.

As the pre-synaptic neuron enters the Flip stage, the post-synaptic electrode enters the Lock stage. The Lock stage effectively locks the post-synaptic voltages in the state decided during the evaluate phase. This can be accomplished through additional circuitry or simply by allowing the continued action of the feedback circuitry. One can see the immediate outcome of this setup: the state that is decided during the output/evaluate phase (i.e. receives more activation) is reinforced in the feedback phase by increasing the electric field.

A series of logic gates can accomplish the above described Output/Evaluate, Flip/Lock phases. Although we have thus far only discussed the case of one pre-synaptic electrode and two post-synaptic electrodes, there are in fact more arrangements. We will now detail three possible configurations, discuss the necessary feedback mechanism, and provide example circuitry. With an understanding of the basic output/evaluate, flip/lock phases, the other electrode arrangements, there state encodings, and the feedback circuitry they require should become clear.

The quanta of update probability acquired during the feedback phase can be matched to exactly balance the degradation due to increasing entropy or spontaneous state transition. In other words, the probability that a nanoparticle will be removed from the electrode gap by random thermal motion, or a nanowire cross junction springs open, or a switching molecule undergoes a transition to its ground state, can be balanced by the plastic probability gained from the feedback phase. This can in turn be used as a mechanism for temperature compensation or to simply gain more control over the circuit parameters. By varying the time periods of both the evaluate and feedback phases, as well a changing the supply voltages, one can "dial in" the correct plastic probability update.

Because the power dissipation via resistive heating from the connections is preferably minimal, one could control the temperature of the chip independently. This would allow for such things as teaching the chip at a higher speed (and higher temperature), and then processing real-time data at a slower speed (and a lower temperature)

Figure 8:
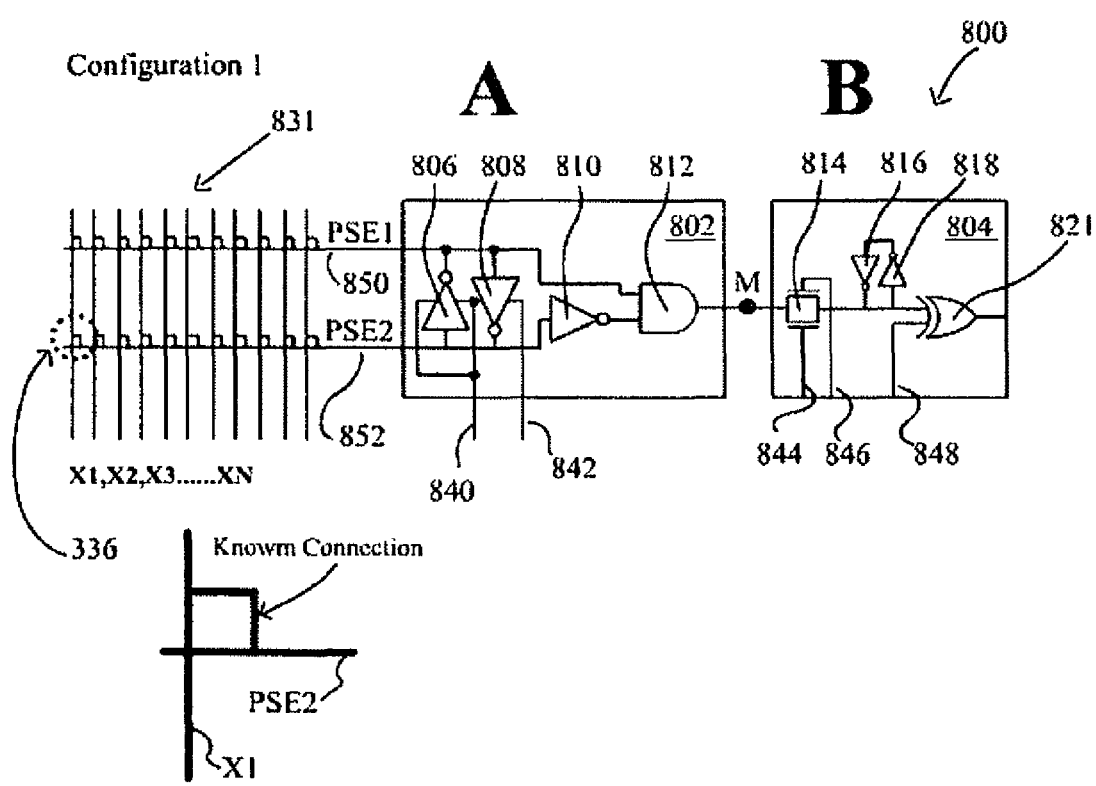
FIG. 8 illustrates a schematic diagram of a circuit, which can be implemented in accordance with one embodiment.
Figure 9:
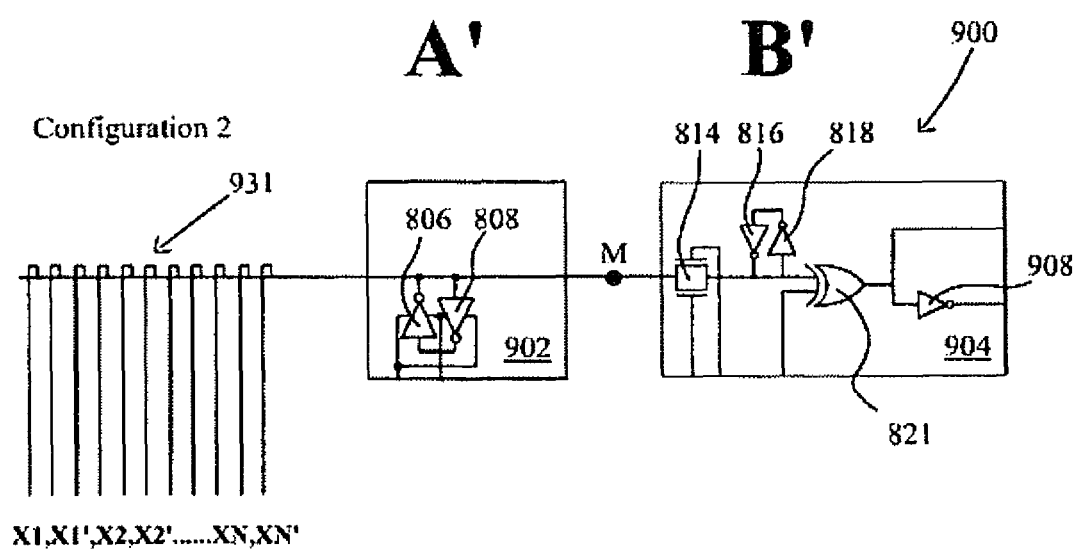
FIG. 9 illustrates a schematic diagram of a circuit, which can be implemented in accordance with another embodiment.
Figure 10:
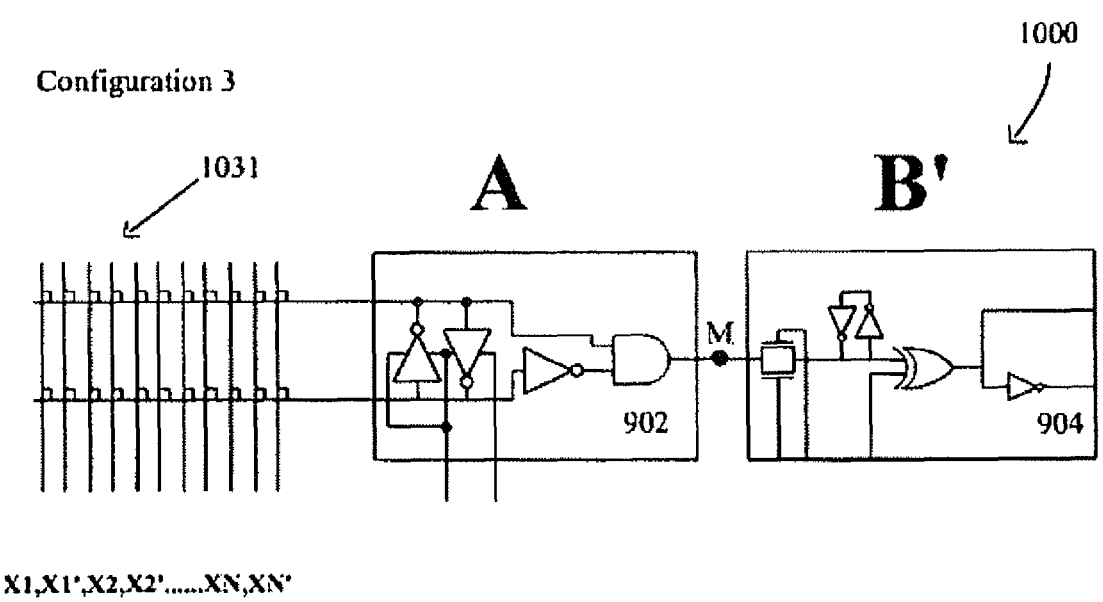
FIG. 10 illustrates a schematic diagram of a circuit, which can be implemented in accordance with an alternative embodiment.

FIG. 8 illustrates a schematic diagram of a circuit 800 for configuration 1 described earlier, which can be implemented in accordance with one embodiment. Similarly, FIG. 9 illustrates a schematic diagram of a circuit 900 for configuration 2 described earlier, which can be implemented in accordance with another embodiment. Likewise, FIG. 10 illustrates a schematic diagram of a circuit 1000 for configuration 3 described earlier, which can be implemented in accordance with an alternative embodiment. Note that in FIGS. 8-9, identical or similar parts are generally indicated by identical reference numerals.

The first configuration (i.e., circuit 800) is essentially the same as the prior example (i.e., circuit layout 302), but is described here for completeness and further clarity. Configuration 1 of circuit 800 generally includes one pre-synaptic electrode per neuron and two post-synaptic electrodes per neuron. The input is applied as a voltage, where a positive voltage, $V_+$, encodes one state and a lower voltage, V encodes the complimentary state. The signal is transferred to the post-synaptic electrodes as a voltage on two differential electrodes.

Circuit 800 generally includes a plurality of electrodes 831, including for example, electrodes X1, X2, etc. and an A circuit 802 and a B circuit 804. The A circuit 802 is composed of tri-state inverters 806, 808, an inverter 810 and an AND logic gate 812. The B circuit 804 generally includes a pass gate 814 and a voltage keeper formed from inverters 816, 818. B circuit 804 also includes an XOR logic gate 821. Note that output from A circuit 802 is connected at node M to the input of B circuit 804. Node M is generally connected to pass gate 814 of the B circuit 804. Circuit lines 844 and 846 of B circuit 804 represent opposite voltage states. Circuit lines 840 and 842 associated with A circuit 802 also represent opposite voltage states. Note that voltage and/or circuit values placed at circuit line 848, which is input to XOR logic gate 821 can be utilized to control flip functionality. Circuit line 850 generally comprises a PSE 1 while circuit line 852 generally constitutes a PSE2.

The voltage on Post-Synaptic Electrode 1 (PSE1) is compared with the voltage on Post-Synaptic Electrode 2 (PSE2). The PSE with a greater voltage determines the state of the neuron. By flipping the pre-synaptic voltage to the opposite voltage and locking the PSE voltages, we strengthen the connections that contributed to the final neural state and weaken (via increasing entropy or spontaneous state transition) the connections that did not contribute. The feedback update is an "on or off" update, lacking incremental control, but of fixed and known quantity. By combining the accumulated probability of connection formation over both the evaluate and feedback stage, we have succeeded in designing a circuit capable of providing a feedback that mirrors the above mentioned plasticity rule.

The circuitry to accomplish the Output/Evaluate and Flip/Lock phases is relatively simple. Generally, there are two basic circuit blocks can be referred to as circuit block "A" and circuit block "B" as indicated previously herein. In FIG. 8, for example, circuit block "A" constitutes circuit 802 and circuit block "B" constitutes circuit 804. Both circuit blocks A and B form the post- and pre-synaptic functions of one neuron, respectively. Consequently, if a network does not contain more that one neural layer, then both circuit blocks may not be required.

The function of circuit block A is two-fold. First, circuit block A (e.g., circuit 802) is responsible for the evaluate stage of the evaluate phase. Second, circuit block A is generally responsible for the "lock" stage of the feedback phase. In fact, only a very simple positive feedback circuit may be required, as can be seen, for example, in the configuration depicted in FIG. 8. Because a neural module will eventually output on only one line, the addition of the inverter 810 on PSE2 and the AND gate 812 provides the following transfer function to generate the voltage on node M, which is given as input to circuit block B. Table 2 below illustrates some of these features:

TABLE 2

| PSE1 | PSE2 | M |
|------|------|---|
| 1 | 1 | 0 |
| 1 | 0 | 1 |
| 0 | 1 | 0 |
| 0 | 0 | 0 |

Circuit block A or circuit 802 depicted in FIG. 8, for example, generally includes the two tri-state inverters 806, 806, one inverter 810 and one AND gate 812. When the tri-state inverters are activated, positive feedback is given to PSE1 and PSE2. As one can see, if PSE1 is high, then the inverter tries to bring PSE2 low, and visa versa. When the inverters are inactive, their output floats and there is no feedback. The evaluate and feedback phases can be generated by selectively activating the feedback circuit in the following manner using circuit lines 840 and 842. During the beginning of the evaluate phase, the feedback is shut off. this allows the voltage on PSE1 and PSE2 to build without feedback. These voltages are thus a representation of the activation as provided by the meta-stable switches synapses. After this first stage of the evaluate phase, the feedback is turned on using, for example, circuit lines 840 and 842.

The feedback forces the voltages on PSE1 and PSE2 into complementary states determined by their initial value set in the previous stage. In other words, the feedback amplifies the difference between PSE1 and PSE2 voltages. When the lock stage is reached, the feedback circuitry of circuit 802 (i.e., the A circuit) simply remains on, thus keeping the voltages at their previous value. At the end of the lock stage, the feedback is turned off. Note that the inverter 810 and the AND gate 812 can act to transfer the two-line representation of two states to a one line representation of two states, as provided by the logic table above (i.e., Table 2)

Circuit block B (e.g., circuit 804) provides the pre-synaptic function of the neurons. In the first stage of the evaluate phase, the circuit 804 produces as an output the input it received during the previous stage. This output is representative of the output state of the neuron and was determined during the evaluate phase by circuit block A. (e.g., circuit 802). After the first stage of the evaluate phase, the output remains the same. In the first stage of the feedback phase, the output flips. This functionality can be accomplished with, for example, pass gate 814, a voltage keeper formed from inverters 816, 818, and XOR gate 821 as depicted in configuration 1 of FIG. 8. Note that the XOR gate 821 can be replaced by its compliment, as the choice is ultimately arbitrary.

Because the stages of the evaluate and feedback phases are controlled by a clock input, the relative widths of the evaluate and feedback phases may be changed electronically "on the fly". The sizes of the transistors making up the feedback circuitry may of course be modified to provide the best balance of chip real estate and functionality. Alternately, the strength of the feedback may be modified electronically by changing voltage biases. All that is reported here, for sake of clarity, is the functionality required. One example is provided herein, but many variations are of course possible.

Figure 11:
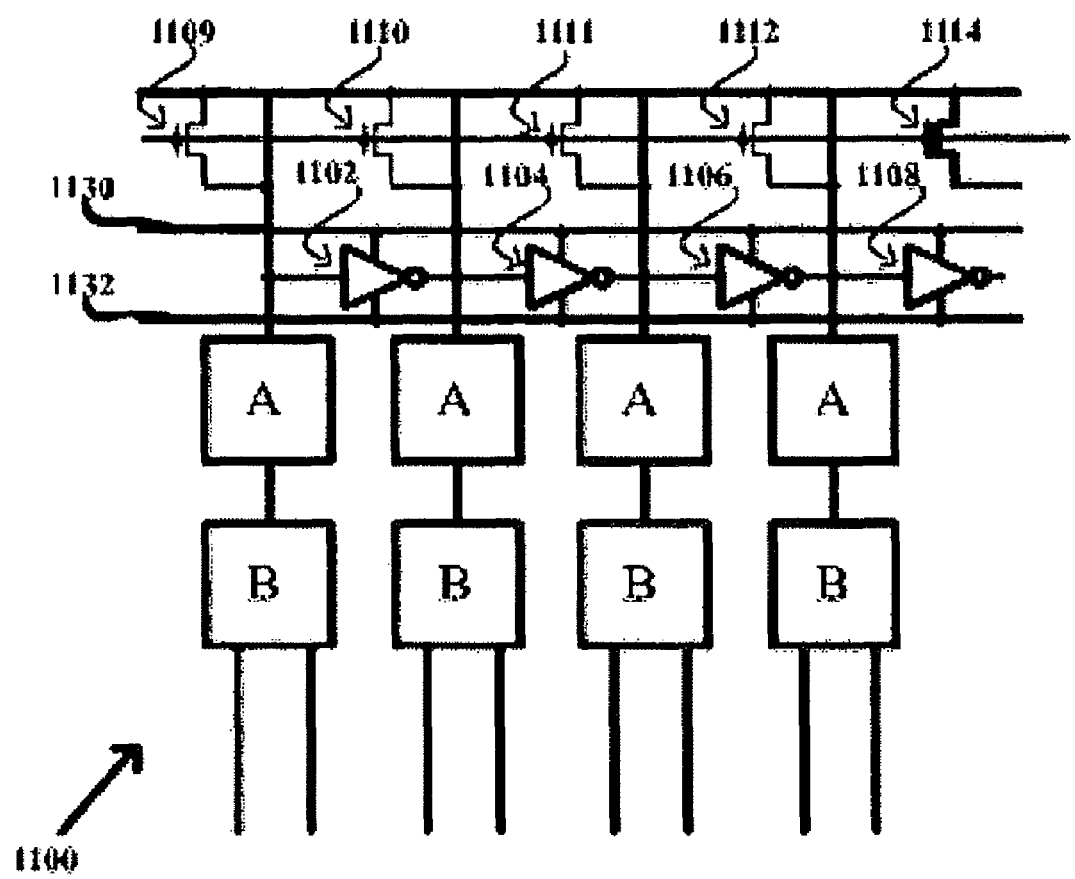
FIG. 11 illustrates a schematic diagram of a circuit, which can be implemented in accordance with an embodiment.

FIG. 11 illustrates a schematic diagram of a circuit 1100, which can be implemented in accordance with an embodiment. Circuit 1100 generally includes a plurality of A and B circuits including tri-state inverters 1102, 1104, 1106 and 1108. Circuit 1100 also includes transistors 1109, 1110, 1111, 1112, and 1114, which are connected to one another via a circuit line 1131. Additionally, tri-state inverters 1102, 1104, 1106 and 1108 can be connected to one another via a circuit line 1130 and circuit line 1132.

Figure 12:
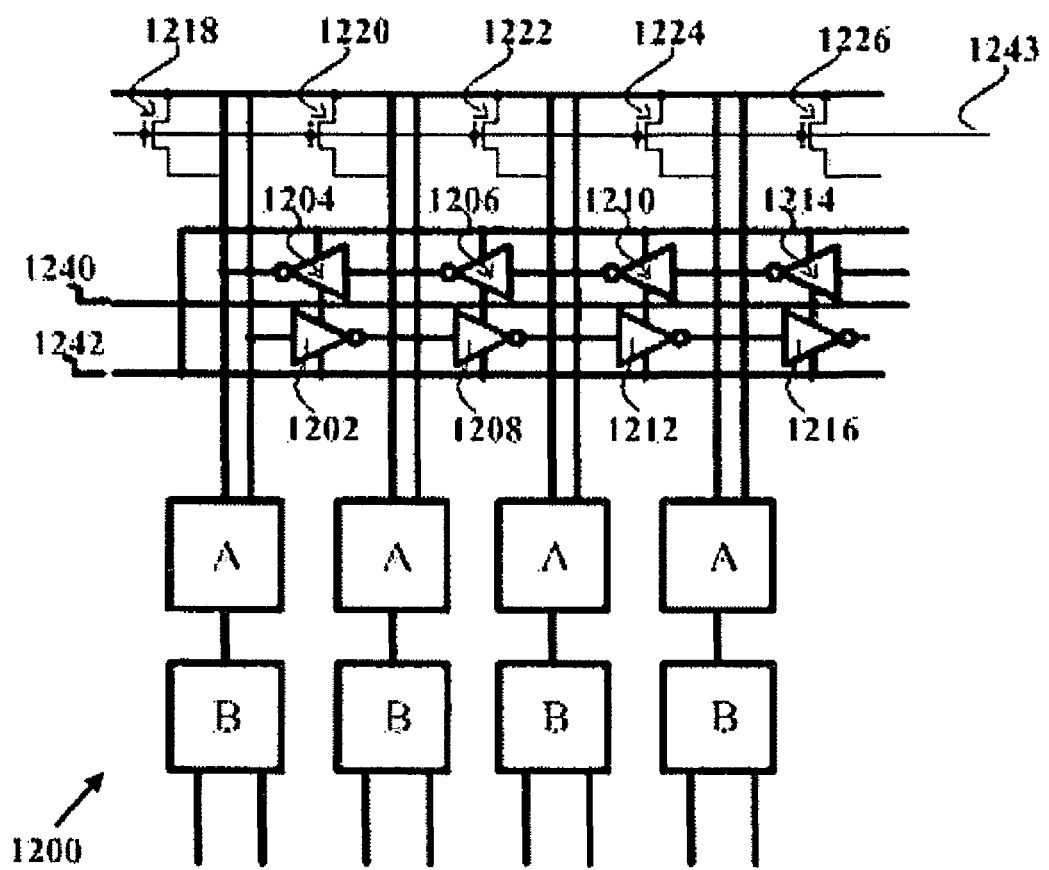
FIG. 12 illustrates a schematic diagram of a circuit, which can be implemented in accordance with an alternative embodiment.

FIG. 12 illustrates a schematic diagram of a circuit 1200, which can be implemented in accordance with an alternative embodiment. Circuit 1200 also includes a plurality of A and B circuits along with tri-state inverters 1202, 1204, 1206, 1208, 1210, 1212, 1212, 1214 and 1216, each connected to circuit lines 1240 and 1242 Circuit 1200 additionally includes transistors 1218, 1220, 1222, 1224, and 1226, which are connected to one another via a circuit line 1240. A circuit control line 1243 can be connected to transistors 1218, 1220, 1222, 1224, and 1226.

In addition to circuit block A and B described above, two pieces of circuitry can be utilized which are useful for the process of initially acquiring the independent component states. First, we must provide for lateral inhibition, or negative feedback between adjacent neural modules. This can be accomplished in exactly the same manner as in circuit block A, except this feedback is between adjacent circuit modules. The purpose of the inhibitory (e.g., negative) feedback is to keep adjacent neurons from acquiring the same IC state. The feedback must posses the ability to turn on and off (e.g., see components 1130, 1132 in FIG. 11) and in fact is off for most of the post-learning lifetime of the chip. As an example, a tri-state inverter may be used to provide negative feedback from PSE1 of one neural module to the PSE1 of an adjacent neural module. Alternately, the feedback could be provided between PSE2 electrodes, or a non-inverting tri-state amplifier between PSE1 and PSE2 of adjacent neural modules. All that is required is that one neuron is capable of pushing its neighbor into another state via lateral inhibition that can be turned on and off.

The second additional piece of circuitry could be as simple as one transistor pulling either PSE1 or PSE2 to a pre-defined state (e.g., voltage), which can be utilized to force a neuron into a known state. In other words, this feedback would be used for a teaching signal, perhaps coming from another chip that has already acquired the states. This teaching signal is important for two reasons, although it is not strictly necessary. The teaching signal can be used to train a group of neural modules to recognize features within the data stream. The knowledge of what constitutes an object is communicated to the chip via the teaching signal, which is a global signal broadcast to all neural modules.

All the circuitry needed to provide the feedback required to emulate the plasticity rule given in equation (2) can be accomplished with the above-mentioned circuitry. Not to loose generality, all that is required is circuitry capable of providing the mechanisms of synaptic integration, plastic feedback, lateral inhibition, and/or teaching. The attraction of particles to the pre- and post-synaptic electrode gaps correlate with an increased conductance. By providing an increased voltage difference to mirror a plasticity rule, the system can auto-regulate and converge to connection strengths suitable for information extraction.

Note that the electrode configurations 2 and 3 respectively depicted in FIGS. 9-10 are variations of the theme developed for configuration 1 depicted in FIG. 8. The basic feedback stages essentially remain the same. Configuration 2 (i.e., circuit 900) depicted in FIG. 9 for example, is similar to configuration 1 (i.e., circuit 800) depicted in FIG. 8. In circuit 900 of FIG. 9, rather that one pre-synaptic electrode and two post-synaptic electrodes, however, there are two pre-synaptic and one post-synaptic electrode per neural module. Circuit 900 generally includes an A' circuit 902 and a B' circuit 904. The A' circuit 902 includes tri-state inverters 806 and 808, while the B' circuit 904 is composed of the same components as the B circuit 804 depicted in FIG. 8, except for the addition of a inverter 908.

The post-synaptic electrode feedback circuitry of circuit 900 (i.e., configuration 2) provides the same mechanism to saturate the voltage; however, this time a high voltage on the post-synaptic electrode indicates State 1 (this is arbitrary) and a low voltage indicates State 2. The following figure indicates circuit block A', which provides the feedback circuitry. As can be seen, the feedback circuitry is simply a voltage keeper circuit that can be regulated by the addition of a tri-state inverter composing one or both of the inverters in the voltage keeper formed from inverters 806 and 808. Circuit block B' is thus identical to that of configuration 1, with the addition of an extra inverter on the output to force two complimentary outputs instead of just one.

Note that lateral inhibition can be accomplished via a tri-state inverter between adjacent post-synaptic electrodes. The teach signal is likewise accomplished by a transistor pulling a post-synaptic electrode to ground or $V_{cc}$ (e.g., see transistors 1109, 1110, etc. of FIG. 11).

Configuration 3 or circuit 1000 depicted in FIG. 10 simply combines aspects of both configuration 1 and configuration 2 by representing both the neural input and output on two electrodes. A pair of input lines defines one "input channel" formed from a PSE1 line or electrode 1002 and PSE2 line or electrode 1004. These input lines are driven to a positive voltage in a complimentary way:

State 1: Input 1=Vcc
Input 2=Gnd
State 2: Input 1=Gnd
Input 2=Vcc

As with configuration 1, the process of neural integration can be viewed as a competition between Post-Synaptic Electrode 1 (PSE1) and Post-Synaptic Electrode 2 (PSE2).

Consider the case where an input channel is in state 1, so that input line 1 (e.g., see X1 in FIG. 10) is "V." and input line 2 (e.g., see X1' in FIG. 10) is "Gnd". If we disregard the other inputs, the total activation of PSE1 is the result of the strength of the meta-stable switch connecting Input 1 and PSE1, which can be referred to as C11. Correspondingly, the total activation of PSE2 is the result of the strength of the meta-stable switch connecting Input 1 and PSE2, which can be referred to as C12. The neural circuitry 1000 depicted in FIG. 10 thus compares the two voltages on PSE1 and PSE2. If PSE1 is larger, the neuron is forced to output voltages on its output channel (e.g., node M in FIG. 10) characteristic of state 1. Alternately, if PSE2 is larger, the neuron is forced to output voltages on its output channel (e.g., node M in FIG. 10) characteristic of state 2.

Based on the foregoing, it can be appreciated that four Knowm™ connections can allow for 4-quadrant multiplication. Listed below is the connection label, as described above, along with the transfer function it facilitates:

Connection 11: State 1→state 1
Connection 12: State 1→state 2
Connection 21: State 2→state 1
Connection 22: State 2→state 2

To further explain such circuitry, it should be noted that, given an input in either state 1 or 2, the value of the 4 meta-stable switches can encode either a "positive" weight:

Connection 11: Strong (many open channels)
Connection 12: Weak (no or few open channels)
Connection 21: Weak
Connection 22: Strong Or a "negative" weight:
Connection 11: Weak
Connection 12: Strong
Connection 21: Strong
Connection 22: Weak By the addition of a feedback mechanism (i.e., feedback circuitry), the four connection values may take on a variety of values representing highly "positive", highly "negative", or anywhere in between. It should be noted that there exists a degeneracy in connections encoding a particular value. This degeneracy is simply a result of four meta-stable switches being used to emulate a two-state system. The advantages of this could include noise immunity via the differential input lines, which could be important for coupling at higher switching frequencies. A two-line representation can also provide a larger dynamic range for a signal, which may increase the noise margin. The circuitries needed to provide the necessary feedback for circuit module A is identical to circuit block A in configuration 1. Likewise, the circuitry required to implement circuit block B is identical to circuit block B in configuration 2.

Figure 13:
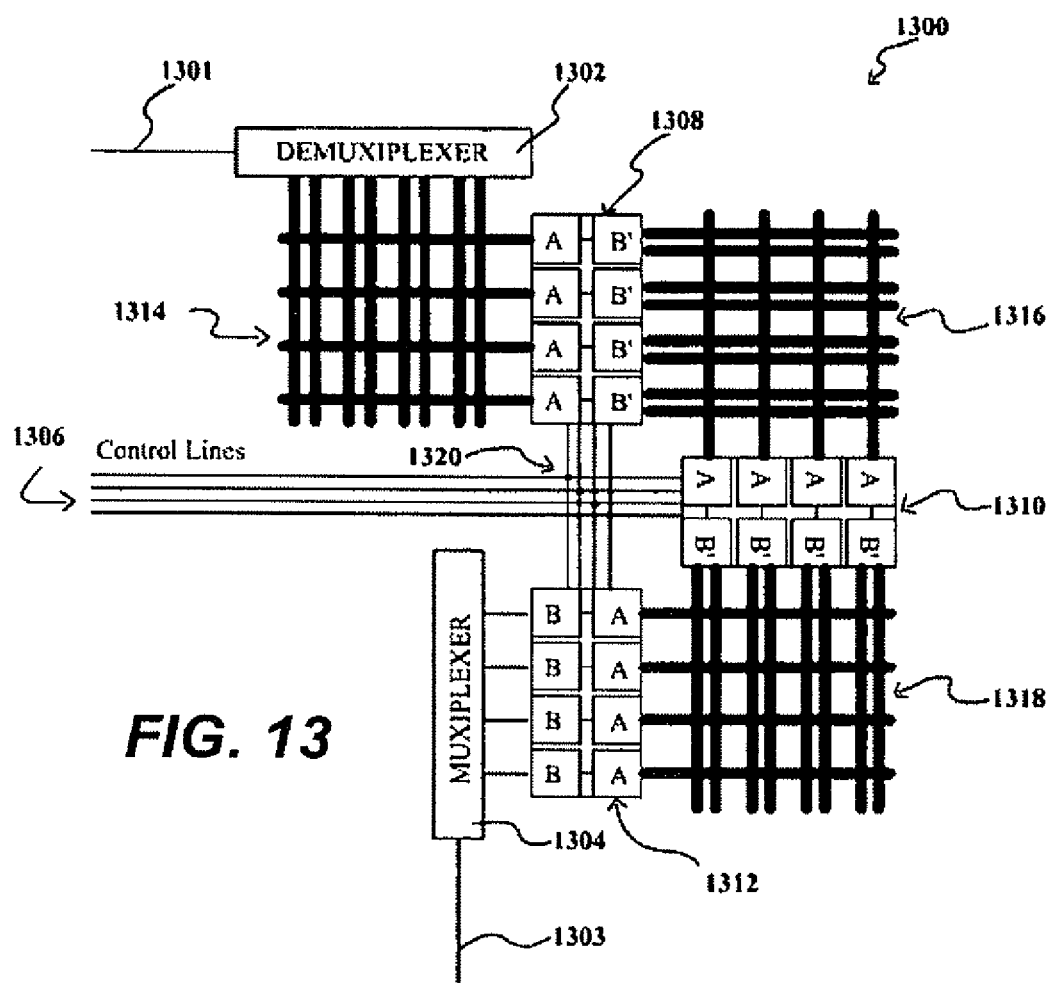
FIG. 13 illustrates a block-level circuit diagram, which can be implemented in accordance with an embodiment.

FIG. 13 illustrates a block-level circuit 1300, which can be implemented in accordance with one embodiment. Circuit 1300 generally includes a demultiplexer 1302 and a multiplexer 1304. A plurality of control lines 1306 is connected to a plurality of A and B' circuits 1310 and also a plurality of circuit lines 1320, which in turn are connected to a plurality of A and B' circuits 1308 and a plurality of A and B circuits 1312. Demultiplexer 1302 is connected to a plurality of electrodes 1314, while the A and B' circuits 1308 are connected to a plurality of electrodes 1316. Additionally, a plurality of electrodes 1318 are connected to the A and B' circuits 1310 and the B and A circuits 1312. Note that the multiplexer 1304 is connected to a circuit line 1303, while the demultiplexer 1302 is connected to a circuit line 1301.

Meta-stable switches can be placed at the intersections of, for example, the B' and A electrodes, which are patterned on the surface of the chip. In this example, data can be streamed into the demultiplexer and applied as input to one or more electrodes. If the data is streamed so as to output the compliment input vector (i.e. to achieve the flip function), then a B circuit is not required. Signals are integrated on the A electrodes of circuit module group 1308. The output of these modules is then applied to the B' electrodes. The signal is integrated via the A electrodes on circuit module group 1310, where the pattern can be repeated for additional layers. The output state of a neural module group can be multiplexed and sent out on an output line 1303. The states of the neural circuit modules within a group can be used to determine the presence of a feature in a data stream.

Figure 14:
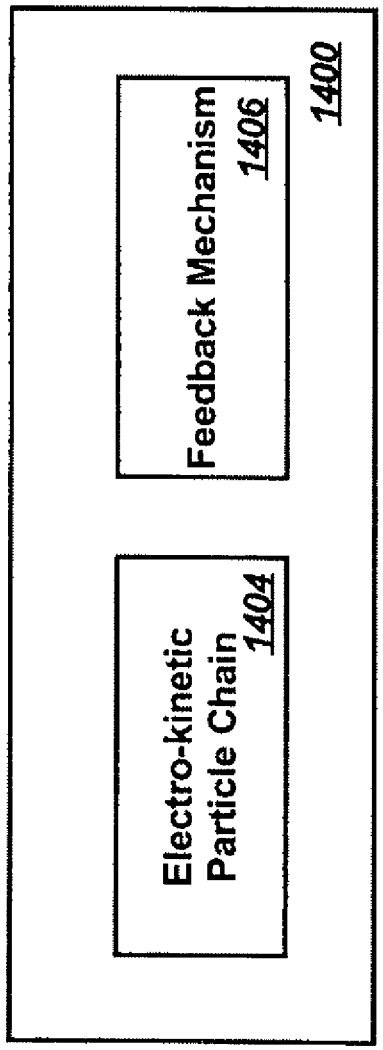
FIGS. 14 and 15 illustrate a high-level block diagram of a system for independent component analysis, which can be implemented in accordance with a preferred embodiment.
Figure 15:
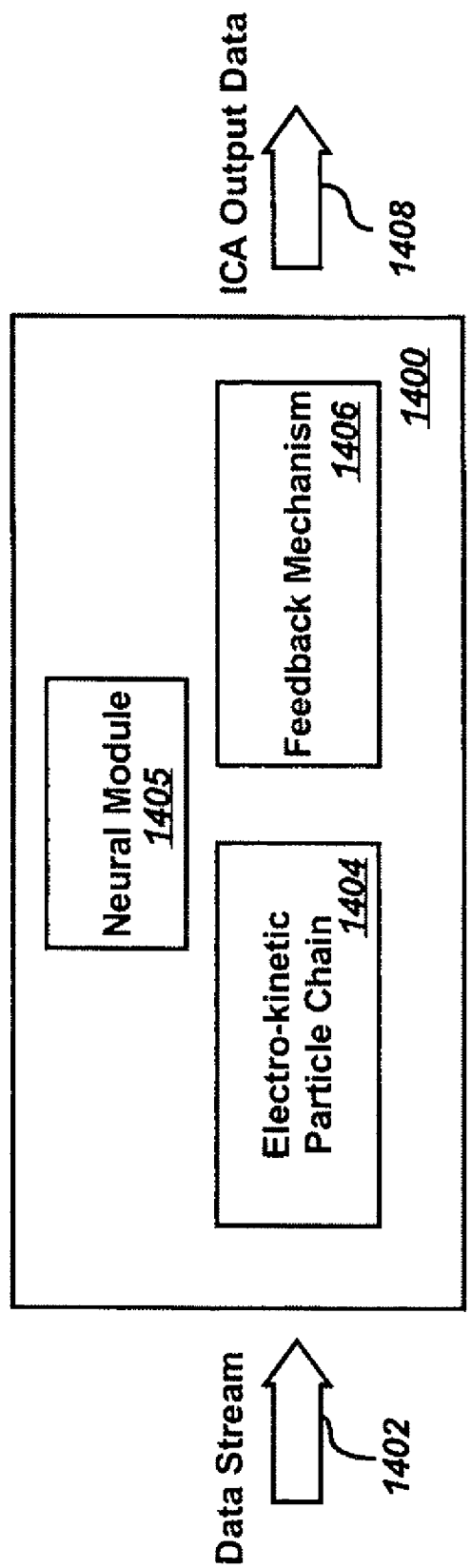

FIGS. 14 and 15 illustrate a high-level block diagram of a system 1400 for independent component analysis, which can be implemented in accordance with a preferred embodiment. In general, system 1400 includes a feedback mechanism 1406 and an electro-induced state transition, such as, for example, a Knowm™ connection of a Knowm™ network, a cross junction of a cross bar architecture, or a switching molecule of a switching molecule architecture. The feedback mechanism 1406 can be implemented in the context of, for example, the feedback circuitry illustrated herein and which operates based on the plasticity rule described herein. The meta-stable switch 14306 interacts with the feedback mechanism 1406 in order to extract independent components from a data set as depicted in FIG. 14 by arrow 1402. ICA output data generated from system 1400 is indicated in FIG. 14 by arrow 1408. FIG. 14 represents one embodiment while FIG. 15 represents another embodiment. The embodiment depicted in FIG. 15 shows the addition of a neural module 1405.

Based on the foregoing, it can be appreciated that the systems and methods disclosed herein is a new technology that extracts information from a data-stream. The information processed drives a state transition in a meta-stable switch into the meta state, and random thermal motion or spontaneous state transition to switch into the ground state, of meta-stable switches. The statistical regularities from the data stream are coupled to state transitions of conduction of channels between pre- and post-synaptic electrodes, which modifies the number of conducting channels and in turn drives modular integrated circuits. As indicated herein, a group of these circuits can be made to extract the statistically independent components of a data stream. By processing information, such a network, for example, remains stable in the face of random thermal motion or spontaneous state transition and actively re-configures its connections to changing conditions.

A meta-stable switch is a nano-scale switchable electrical connection formed from nanoparticles or molecules. The meta-stable switches form sets of connections, where the group is referred to as a synapses. These synapses may be modified by a plasticity rule. We must provide a way to transfer voltages produced by neural circuit modules to a force that alters the conducting state of the meta-stable switched. Electric fields are the most convenient way of generating this force.

Generally speaking, modern electronics contain two components: transistors and the wires that connect them. The transistors are like a mathematical function. They have an input and an output. By arranging and building transistors in clever ways, they can be made to store information. In almost all cases, modern electronics separate computation from memory.

Neural networks, such as a brain, also generally contain two components: neurons and the connections between them. The neurons are not unlike transistors. They too are like a mathematical function. The connections between neurons, i.e. synapses, are very different than the wires between transistors. Synapses can change, which means they have a memory, and the way they change is governed by a plasticity rule.

The rule(s) is (are) simple. The rule takes as its input local information, and provides as its output the change in synapse strength. Knowm™ plasticity rules use two signals: the pre-synaptic signal and the post-synaptic signal. These signals are provided as voltages on electrodes.

Plasticity rules are capable of computation and adaptation. A Knowm™ network utilizes plasticity rules to accomplish most of what it does. The rule configures groups of meta-stable switches to form reliable connections. The rule uses the information from a data stream to spontaneously set groups of meta-stable switched at strengths that optimally extract information. The rule, using statistical regularities in the input data stream, re-configures the states of flipped meta-stable switches. If neural circuitry is damaged and becomes unreliable or unresponsive, the rule re-wires the network to optimize performance by re-configuring the states of the meta-stable switches, assuming a degree of redundancy.

Neural modules, built from CMOS (or equivalent transistor-based technology), can be utilized to provide feedback to pre- and post-synaptic electrodes. This feedback creates the electric force that mirrors a plasticity rule capable of the above mentioned feats. The neural modules generally contain less than 40 transistors. A group of these modules can be used to isolate statistical regularities in a data stream. With today's technology, hundreds of thousands of these module groups can be built on a single integrated circuit, along with billions of self-assembling meta-stable connections.

A meta-stable switch, by definition, is not stable. The statistical properties of a group of meta-stable switches, under the influence of a plasticity rule, is stable.

Implementation of Methodology in a Universal Reconfigurable Logic Gate

As transistor densities on modern integrated electronic chips increase, there is a growing trend toward reconfigurable architectures. Rather than implementing application specific integrated circuits (ASIC), a design is deployed on programmable logic devices. The move is creating a growing trend toward an IP-based development process, where circuits are defined by their programming routine rather than the actual physical layout. Rather than implementing a program to run on a processor, for example, a chip can run a program to build the processor.

There are many ways to build such a system. One feature for constructing a programmable logic device is referred to as the grain size. As the device must be programmed, the question naturally arises as to what, exactly, is being programmed. Given a particular computational task, the device must use what resources are at is disposal to implement a solution. A course-grained architecture may implement a relatively small number of complex modules, where each module contains an array of various logic, memory, flip-flops and perhaps even entire microprocessors. As the architecture becomes finer, the complexity of the individual cell decreases and the number of the cells increase.

Perhaps the finest-grain architecture one might imagine is a block that can be programmed to implement any 2-input, 1-output logic gate. By constructing a vast array of Universal Logic Gates, one can envision a system that can be programmed at a very fine scale, improving the ultimate efficiency of the final circuit.

A hybrid CMOS/Knowm™ logic device is disclosed herein that can be "taught" to implement any of the 16 possible 2-input/1-output logic functions. It can be appreciated that CMOS is one example of a transistor-based technology and others may be used. Alternate logic devices are natural extensions of this base concept. The descriptions contained herein, although specific to a 2-input, 1-output logic device, can be extended to arbitrary input-output dimensions. The design is composed of a CMOS core of about 40 transistors, as well as a meta-stable switch synapse matrix formed above the CMOS core. The design is relatively space-efficient, considering the power it has to implement any of the 16 total 2-input, 1-out logic functions. An understanding of the process requires an understanding of the plasticity rule described herein under the application of binary inputs, or more specifically knowledge of the possible fixed-points or attractor states. Such a plasticity rule has also been discussed previously.

Figure 16:
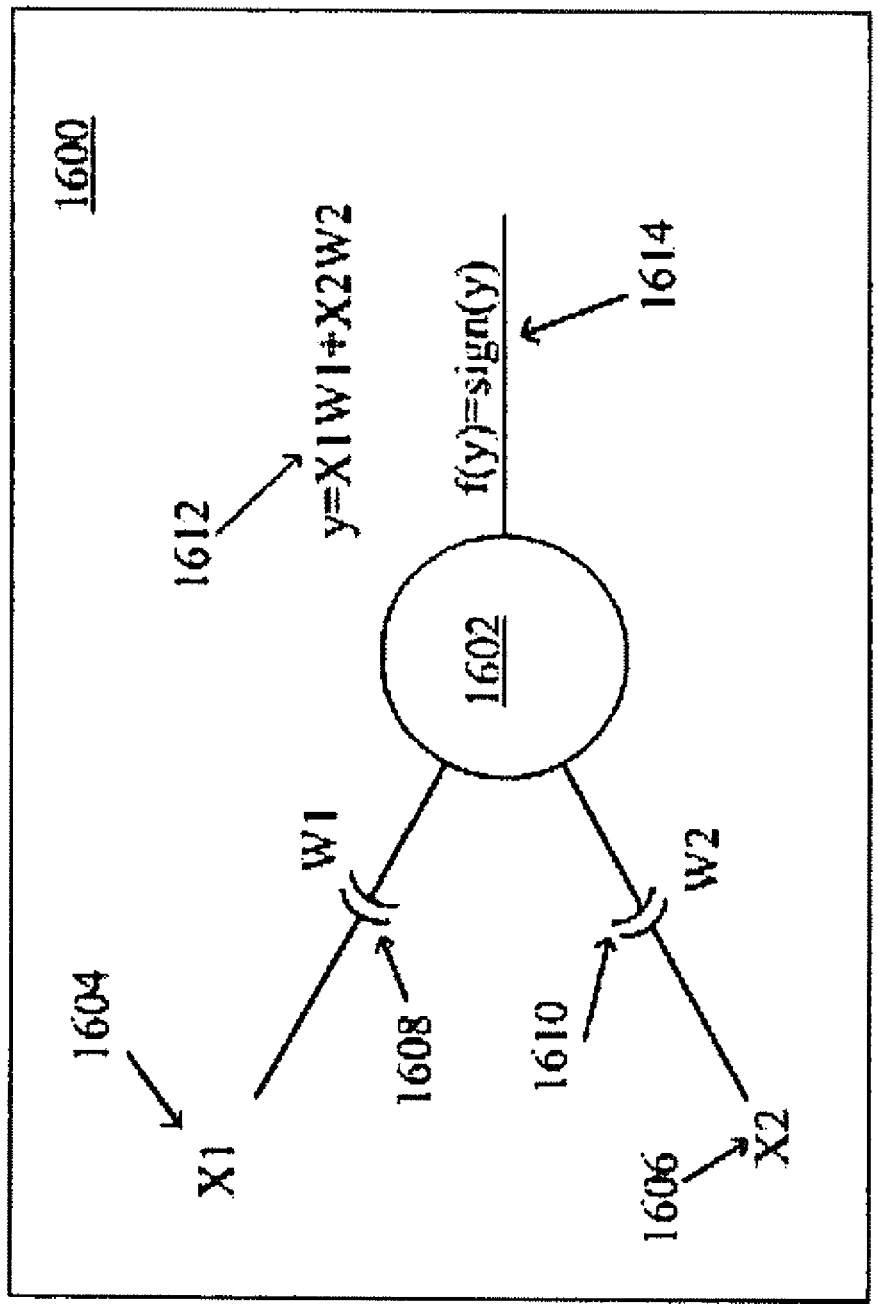
FIG. 16 illustrates a configuration that includes a neuron with synapse inputs, in accordance with one embodiment.

Consider the configuration of FIG. 16, which illustrates a simple system 1600 that includes a neuron 1602 with two inputs 1604 and 1606, respectively connected via two synapses 1608 and 1610. The neuron 1602 may only output one of two states, but achieves a graded activation, defined by equation 1612 as $y=w_1x_1+w_2x_2$, where $w_1$ is the weight connecting the $i^{th}$ input to the neuron 1602. The output 1614 from neuron 1602 can be provided as $f(y)=\text{sign}(y)$. The state of the neuron 1602 can be seen as the sign (or state) of the activation.

The values of the synapses 1608 and 1610 can be allowed to evolve under the auspices of the AHAH plasticity rule. There are many potential techniques for implementing the AHAH rule as a mathematical equation. The most general description of the feedback can be simply the following: "The connection between pre-synaptic electrode A and post-synaptic electrode B is modified in the direction that facilitates the transfer of electrode A's state to electrode B's state."

For a digital application with two inputs, there are only four possible input patterns. For the moment, will refer to the states as "+1" and "−1" rather than "1" and "0". This is because the explicit sign (or state) of the input is important for AHAH modification. The four possible input patterns are:

$$[+1,+1],[+1,-1],[-1,+1],[-1,-1]. \qquad \text{Dataset 1}$$

It can be verified that the stable weight vectors resulting from the application of these four input patterns under the AHAH plasticity rule are provided as: $[w_1, w_2]=[0,+1],[0,-1],[+1,0],[-1,0]$.

Such states can be referred to as S1 though S4, respectively. The following logic tables indicate the output of a neuron in each of the four possible states. Note that S1=X2, S2=~X2, S3=X1 and S4=~X1, where "~" indicates the logical compliment.

TABLE 3

| S1 [0, +1] | | | S2 [0, −1] | | | S3 [+1, 0] | | | S4 [−1, 0] | | |
|---|---|---|---|---|---|---|---|---|---|---|---|
| X1 | X2 | S1 | X1 | X2 | S2 | X1 | X2 | S3 | X1 | X2 | S4 |
| 1 | 1 | 1 | 1 | 1 | −1 | 1 | 1 | 1 | 1 | 1 | −1 |
| 1 | −1 | −1 | 1 | −1 | 1 | 1 | −1 | 1 | 1 | −1 | −1 |
| −1 | 1 | 1 | −1 | 1 | −1 | −1 | 1 | −1 | −1 | 1 | 1 |
| −1 | −1 | −1 | −1 | −1 | 1 | −1 | −1 | −1 | −1 | −1 | 1 |

One can view the output of a neuron under the influence of the AHAH rule and processing the dataset 1, as either passing or inverting one of the two inputs, depending on its state. To aid in all future discussion, we will make the substitution −1→0 to conform to standard convention. It is important, however, to view "0" as a state, rather than a number, since multiplication by zero is zero and therefore not representative of the AHAH rule. To achieve useful logic functions, we can take two neurons, each occupying a state, and NAND their outputs.

Figure 17:
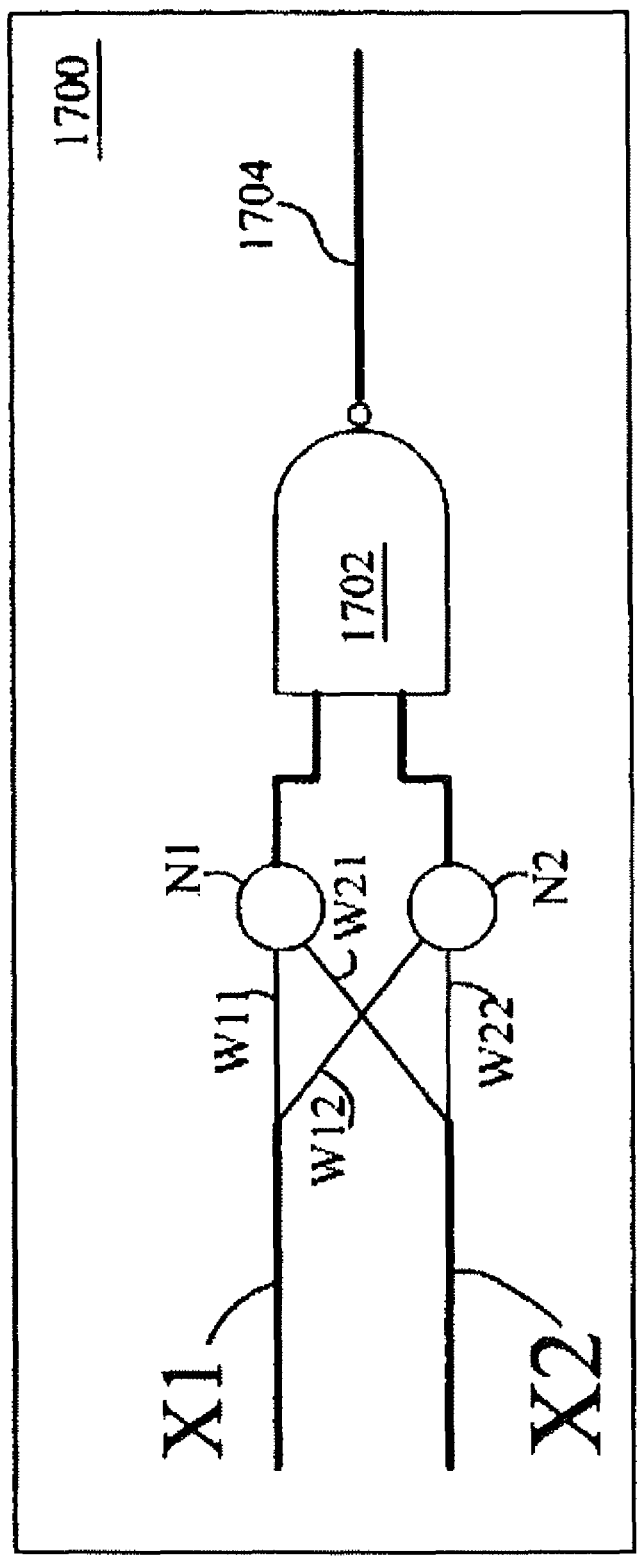
FIG. 17 illustrates a system of neurons and a logic gate, in accordance with another embodiment.

FIG. 17 illustrates a system 1700 that generally includes a logic gate 1702 having an output 1704. Logic gate 1702 receives inputs respectively from the output of neurons N1 and N2 depicted in FIG. 17. Depending on the state of the neurons, the output will follow the rules of various logic functions. This can be seen in table 4, where the functionality of circuit 1700, shown in FIG. 17, can be tested for logic functionality.

TABLE 4

| | [S1, S2] | | | | | | | | | | | | | | | |
|---|---|---|---|---|---|---|---|---|---|---|---|---|---|---|---|---|
| [X1, X2] | [1, 1] | [1, 2] | [1, 3] | [1, 4] | [2, 1] | [2, 2] | [2, 3] | [2, 4] | [3, 1] | [3, 2] | [3, 3] | [3, 4] | [4, 1] | [4, 2] | [4, 3] | [4, 4] |
| [1, 1] | 0 | 1 | 0 | 1 | 1 | 1 | 1 | 1 | 0 | 1 | 0 | 1 | 1 | 1 | 1 | 1 |
| [1, 0] | 1 | 1 | 1 | 1 | 1 | 0 | 0 | 1 | 1 | 0 | 0 | 1 | 1 | 1 | 1 | 1 |

TABLE 4-continued

| | [S1, S2] | | | | | | | | | | | | | | | |
|---|---|---|---|---|---|---|---|---|---|---|---|---|---|---|---|---|
| [X1, X2] | [1, 1] | [1, 2] | [1, 3] | [1, 4] | [2, 1] | [2, 2] | [2, 3] | [2, 4] | [3, 1] | [3, 2] | [3, 3] | [3, 4] | [4, 1] | [4, 2] | [4, 3] | [4, 4] |
| [0, 1] | 0 | 1 | 1 | 0 | 1 | 1 | 1 | 1 | 1 | 1 | 1 | 1 | 0 | 1 | 1 | 0 |
| [0, 0] | 1 | 1 | 1 | 1 | 1 | 0 | 1 | 0 | 1 | 1 | 1 | 1 | 1 | 0 | 1 | 0 |
| Logic Gate | 11 | 1 | 9 | 3 | 1 | 6 | 5 | 2 | 9 | 5 | 13 | 1 | 3 | 2 | 1 | 4 |

Where the logic gates have been numbered according to the following scheme:

TABLE 5

| [1, 1] | [1, 0] | [0, 1] | [0, 0] | Logic Gate |
|---|---|---|---|---|
| 1 | 1 | 1 | 1 | 1 |
| 1 | 1 | 1 | 0 | 2 |
| 1 | 1 | 0 | 1 | 3 |
| 1 | 1 | 0 | 0 | 4 |
| 1 | 0 | 1 | 1 | 5 |
| 1 | 0 | 1 | 0 | 6 |
| 1 | 0 | 0 | 1 | 7 |
| 1 | 0 | 0 | 0 | 8 |
| 0 | 1 | 1 | 1 | 9 |
| 0 | 1 | 1 | 0 | 10 |
| 0 | 1 | 0 | 1 | 11 |
| 0 | 1 | 0 | 0 | 12 |
| 0 | 0 | 1 | 1 | 13 |
| 0 | 0 | 1 | 0 | 14 |
| 0 | 0 | 0 | 1 | 15 |
| 0 | 0 | 0 | 0 | 16 |

As an example, under this numbering scheme, XOR="10", AND="8" and OR="9". As can be seen, circuit 1700 is not capable of implementing every logic function, since the state [S1, S2] is equivalent to [S2, S1] when "NANDed". Such a situation can create degeneracy in logic functionality in that differing neural states can lead to the same logic function. One could replace the NAND gate with a NOR gate and achieve similar results. In all cases, because of the degeneracy, even though two neurons are capable of occupying 16 distinct states, different neuron states still can lead to the same logic function (degeneracy). The following table lists the following attainable logic functions for various "extractor logic gates". In other words, the NAND gate in circuit 1700 could be replace with a NOR gate or an XOR gate or any other "extractor logic gate".

TABLE 6

| Extractor gate | Attainable Logic Functions |
|---|---|
| NAND | 1, 2, 3, 4, 5, 6, 9, 11, 13 |
| NOR | 4, 8, 11, 12, 13, 14, 15, 16 |
| XOR | 1, 7, 10, 16 |

It is unfortunate that circuit 1700 does not attain the XOR function (Logic functions 7 and 10). To attain a greater gate functionality, the circuitry should be modified slightly. I, is certainly possible to consider a circuit composed of three neurons and two NAND gates. That is, three neurons NANDed together or the output of two NANDed neurons NANDed with a third neuron. However, this gate offers little benefit from circuit 1700. To achieve true universal logic function, a four neuron implementation is preferred, which is composed of 2 instances of circuit 1700.

Figure 3B:
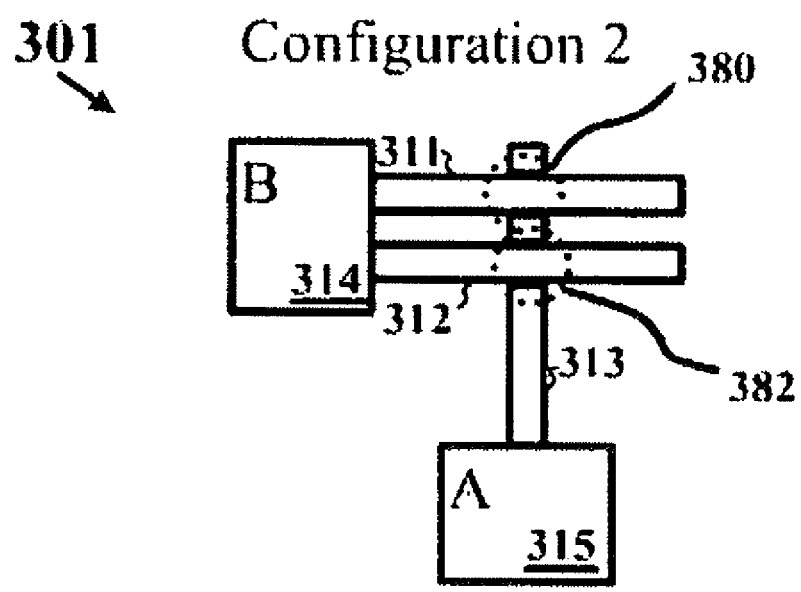
Figure 3C:
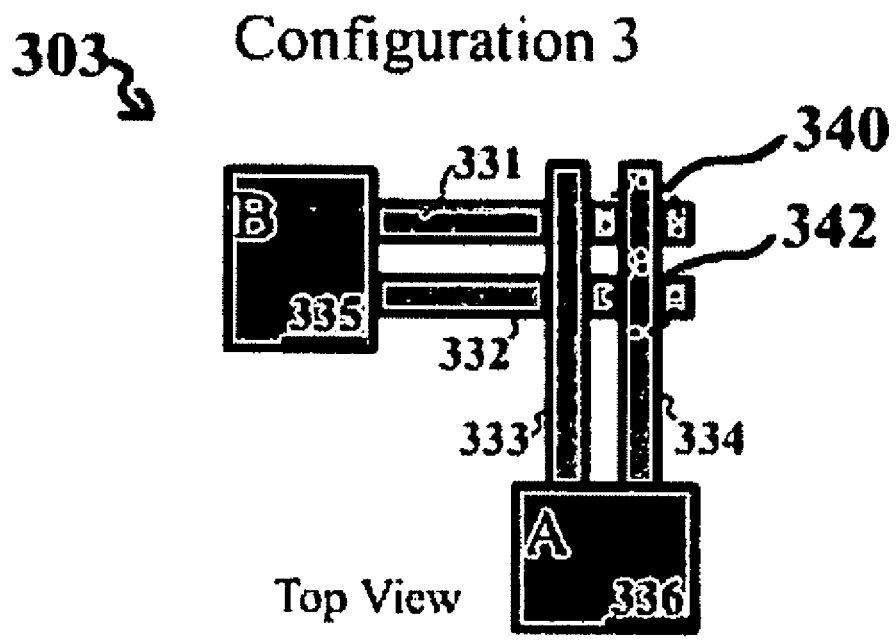
Figure 3D:
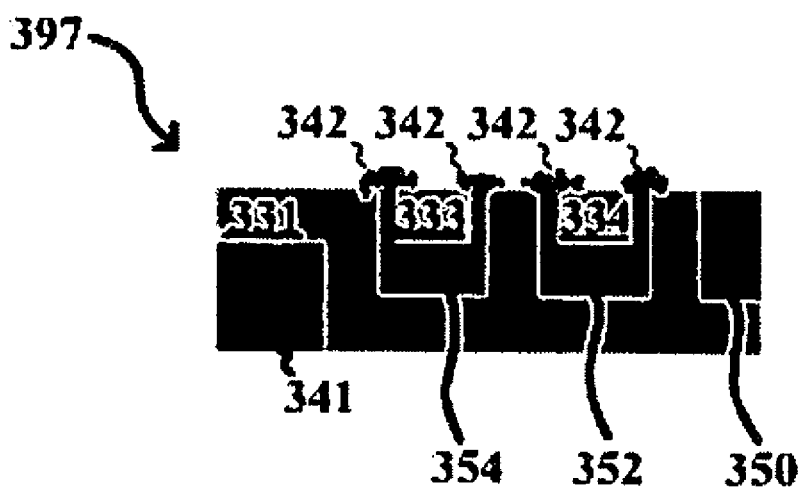
Figure 18:
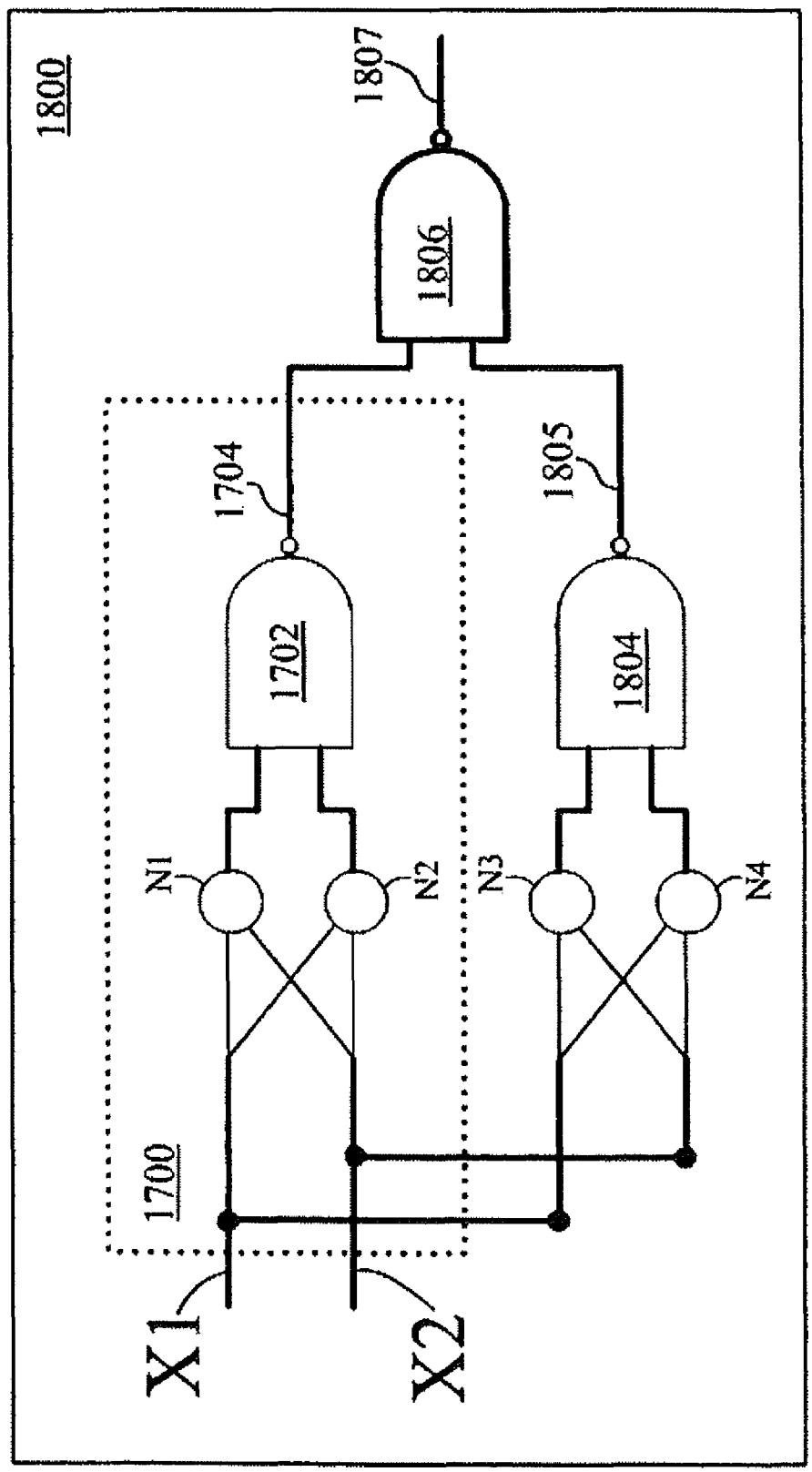
FIG. 18 illustrates a system of neurons and logic gates, in accordance with a further embodiment.
Figure 19:
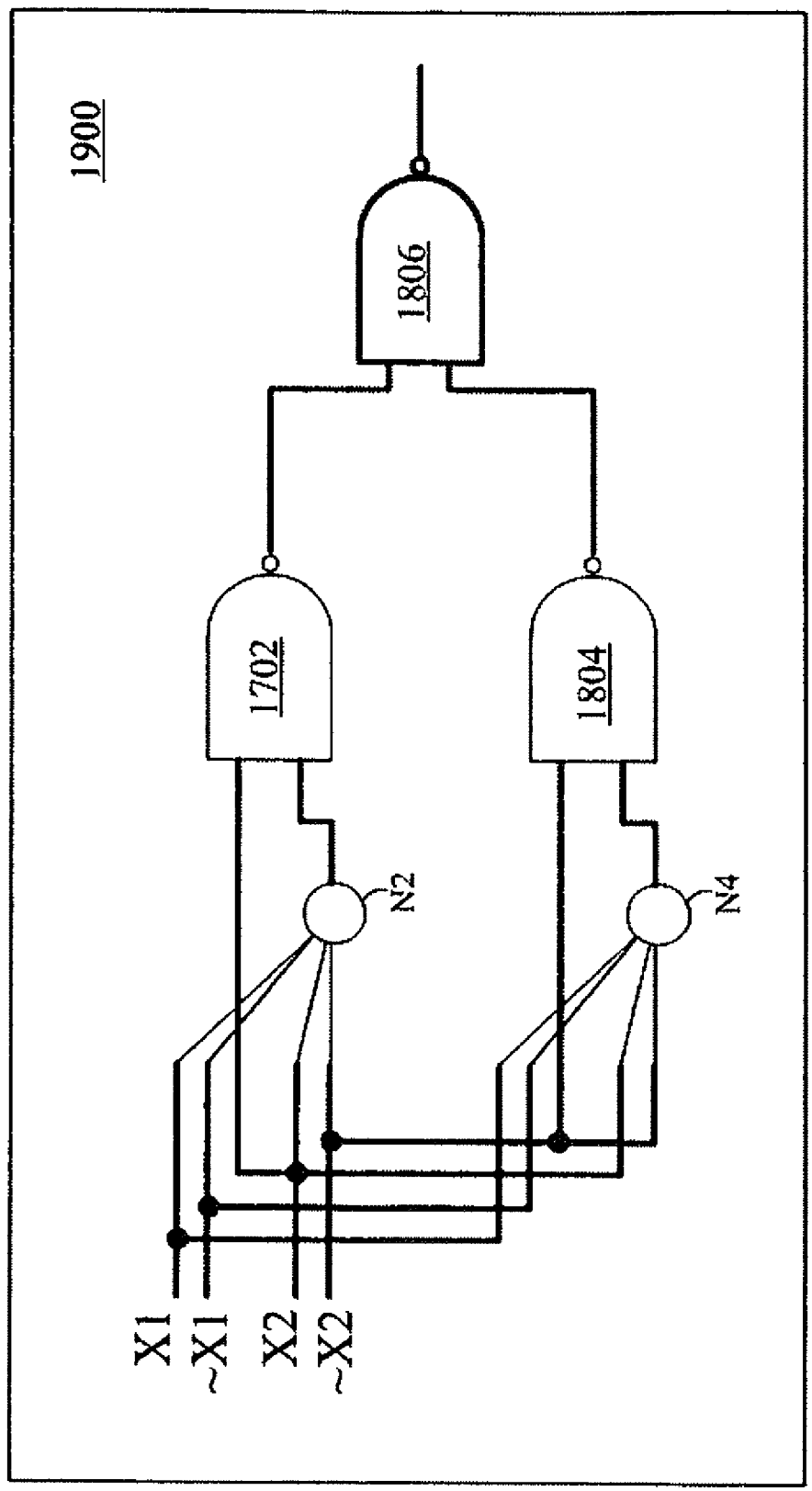
FIG. 19 illustrates a system of neurons and logic gates in accordance with another embodiment.
Figure 20:
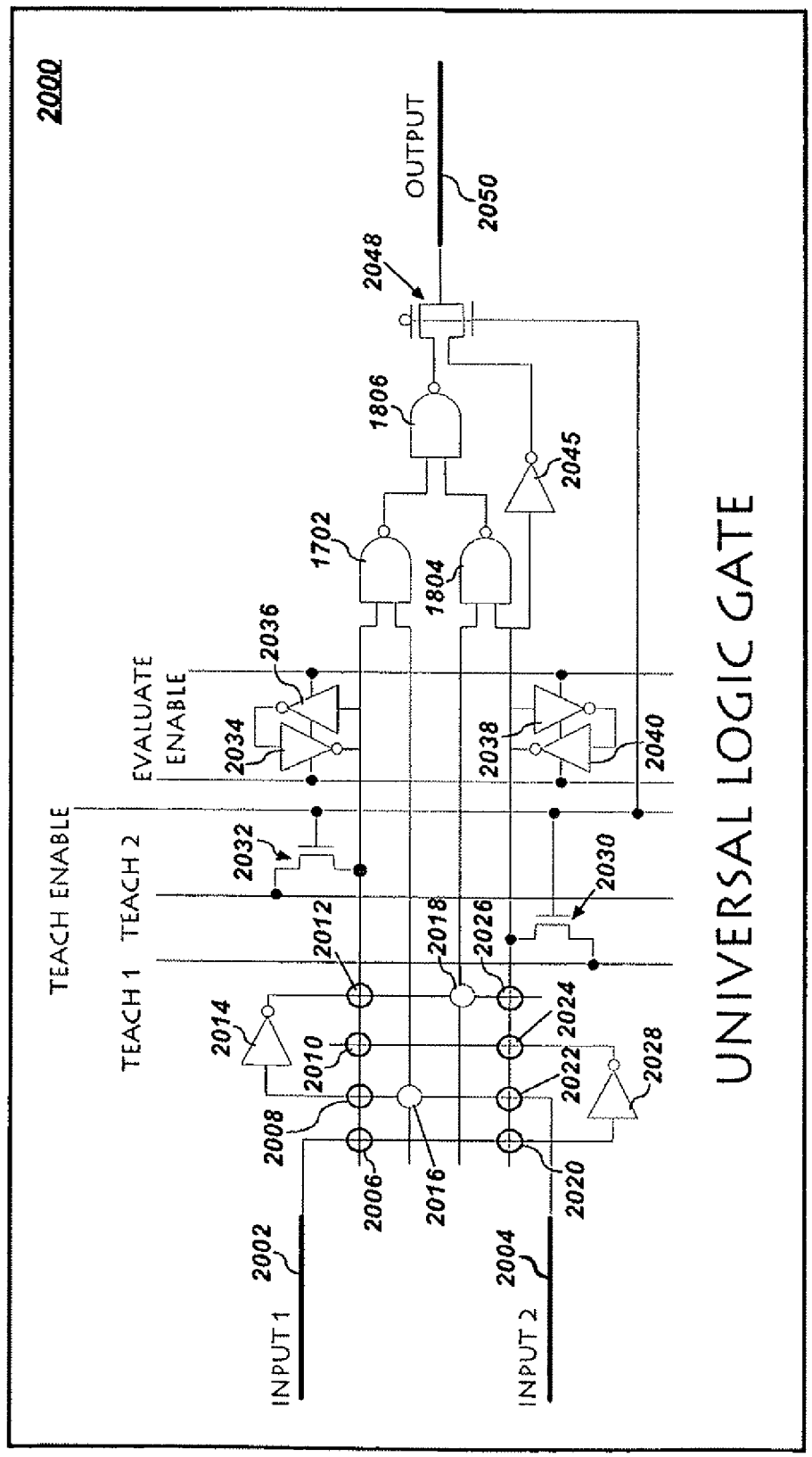
FIG. 20 illustrates a universal logic gate system that can be implemented in accordance with a preferred embodiment.

Note that in a physical implementation, each input line is preferably represented on a differential electrode pair, as seen in FIGS. 3a-3c. The differential representation can be seen explicitly in FIG. 18, which depicts a system 1800 that includes logic gates 1702, 1804 and 1806. Note that in FIGS. 17-20, identical parts or elements are generally indicated by identical reference numerals. In system 1800, X1 and X2 inputs are provided to neurons N1 and N2 and to neurons N3 and N4. Output from neurons N1 and N2 is provided to logic gate 1702 whose output 1704 is input to logic gate 1806. Similarly, the output from neurons N3 and N4 is provided as input to logic gate 1804 whose output 1805 is provided as input to logic gate 1806. Output from logic gate 1806 is provided at output 1804.

It can be demonstrated that universal logic functionality can be found in various subspaces in the neural states. This allows designers to simplify the circuitry considerably so that universal logic function can be attainable with relatively little circuit overhead. Table 7 lists the logic gate function for all 256 possible input states. The table has been ordered by logic gate.

Each neuron in the circuit 1800 can occupy four states, which we have shown previously. There are therefore $4^4=256$ possible state combinations. The following table lists all 256 possible state configurations, as well as the over-all circuit 1800 logic function. As one can see, multiple states lead to the same logic function. This time, however, every possible logic function can be attained.

TABLE 7

| S1 | S2 | S3 | S4 | Logic Gate |
|---|---|---|---|---|
| 1 | 1 | 2 | 2 | 1 |
| 2 | 2 | 1 | 1 | 1 |
| 3 | 3 | 4 | 4 | 1 |
| 4 | 4 | 3 | 3 | 1 |
| 1 | 1 | 2 | 3 | 2 |
| 1 | 1 | 3 | 2 | 2 |
| 1 | 1 | 3 | 3 | 2 |
| 1 | 4 | 3 | 3 | 2 |
| 2 | 3 | 1 | 1 | 2 |
| 3 | 2 | 1 | 1 | 2 |
| 3 | 3 | 1 | 1 | 2 |
| 3 | 3 | 1 | 4 | 2 |
| 3 | 3 | 4 | 1 | 2 |
| 4 | 1 | 3 | 3 | 2 |
| 1 | 3 | 2 | 2 | 3 |
| 2 | 2 | 1 | 3 | 3 |
| 2 | 2 | 3 | 1 | 3 |
| 2 | 2 | 3 | 3 | 3 |
| 2 | 4 | 3 | 3 | 3 |
| 3 | 1 | 2 | 2 | 3 |
| 3 | 3 | 2 | 2 | 3 |
| 3 | 3 | 2 | 4 | 3 |
| 3 | 3 | 4 | 2 | 3 |
| 4 | 2 | 3 | 3 | 3 |
| 1 | 2 | 3 | 3 | 4 |
| 1 | 3 | 2 | 3 | 4 |
| 1 | 3 | 3 | 2 | 4 |

TABLE 7-continued

| S1 | S2 | S3 | S4 | Logic Gate |
|---|---|---|---|---|
| 1 | 3 | 3 | 3 | 4 |
| 2 | 1 | 3 | 3 | 4 |
| 2 | 3 | 1 | 3 | 4 |
| 2 | 3 | 3 | 1 | 4 |
| 2 | 3 | 3 | 3 | 4 |
| 3 | 1 | 2 | 3 | 4 |
| 3 | 1 | 3 | 2 | 4 |
| 3 | 1 | 3 | 3 | 4 |
| 3 | 2 | 1 | 3 | 4 |
| 3 | 2 | 3 | 1 | 4 |
| 3 | 2 | 3 | 3 | 4 |
| 3 | 3 | 1 | 2 | 4 |
| 3 | 3 | 1 | 3 | 4 |
| 3 | 3 | 2 | 1 | 4 |
| 3 | 3 | 2 | 3 | 4 |
| 3 | 3 | 3 | 1 | 4 |
| 3 | 3 | 3 | 2 | 4 |
| 3 | 3 | 3 | 3 | 4 |
| 3 | 3 | 3 | 4 | 4 |
| 3 | 3 | 4 | 3 | 4 |
| 3 | 4 | 3 | 3 | 4 |
| 4 | 3 | 3 | 3 | 4 |
| 1 | 1 | 2 | 4 | 5 |
| 1 | 1 | 4 | 2 | 5 |
| 1 | 1 | 4 | 4 | 5 |
| 1 | 3 | 4 | 4 | 5 |
| 2 | 4 | 1 | 1 | 5 |
| 3 | 1 | 4 | 4 | 5 |
| 4 | 2 | 1 | 1 | 5 |
| 4 | 4 | 1 | 1 | 5 |
| 4 | 4 | 1 | 3 | 5 |
| 4 | 4 | 3 | 1 | 5 |
| 1 | 1 | 1 | 1 | 6 |
| 1 | 1 | 1 | 2 | 6 |
| 1 | 1 | 1 | 3 | 6 |
| 1 | 1 | 1 | 4 | 6 |
| 1 | 1 | 2 | 1 | 6 |
| 1 | 1 | 3 | 1 | 6 |
| 1 | 1 | 3 | 4 | 6 |
| 1 | 1 | 4 | 1 | 6 |
| 1 | 1 | 4 | 3 | 6 |
| 1 | 2 | 1 | 1 | 6 |
| 1 | 3 | 1 | 1 | 6 |
| 1 | 3 | 1 | 4 | 6 |
| 1 | 3 | 4 | 1 | 6 |
| 1 | 4 | 1 | 1 | 6 |
| 1 | 4 | 1 | 3 | 6 |
| 1 | 4 | 3 | 1 | 6 |
| 2 | 1 | 1 | 1 | 6 |
| 3 | 1 | 1 | 1 | 6 |
| 3 | 1 | 1 | 4 | 6 |
| 3 | 1 | 4 | 1 | 6 |
| 3 | 4 | 1 | 1 | 6 |
| 4 | 1 | 1 | 1 | 6 |
| 4 | 1 | 1 | 3 | 6 |
| 4 | 1 | 3 | 1 | 6 |
| 4 | 3 | 1 | 1 | 6 |
| 1 | 3 | 2 | 4 | 7 |
| 1 | 3 | 4 | 2 | 7 |
| 2 | 4 | 1 | 3 | 7 |
| 2 | 4 | 3 | 1 | 7 |
| 3 | 1 | 2 | 4 | 7 |
| 3 | 1 | 4 | 2 | 7 |
| 4 | 2 | 1 | 3 | 7 |
| 4 | 2 | 3 | 1 | 7 |
| 1 | 2 | 1 | 3 | 8 |
| 1 | 2 | 3 | 1 | 8 |
| 1 | 3 | 1 | 2 | 8 |
| 1 | 3 | 1 | 3 | 8 |
| 1 | 3 | 2 | 1 | 8 |
| 1 | 3 | 3 | 1 | 8 |
| 1 | 3 | 3 | 4 | 8 |
| 1 | 3 | 4 | 3 | 8 |
| 2 | 1 | 1 | 3 | 8 |
| 2 | 1 | 3 | 1 | 8 |
| 3 | 1 | 1 | 2 | 8 |
| 3 | 1 | 1 | 3 | 8 |
| 3 | 1 | 2 | 1 | 8 |
| 3 | 1 | 3 | 1 | 8 |
| 3 | 1 | 3 | 4 | 8 |
| 3 | 1 | 4 | 3 | 8 |
| 3 | 4 | 1 | 3 | 8 |
| 3 | 4 | 3 | 1 | 8 |
| 4 | 3 | 1 | 3 | 8 |
| 4 | 3 | 3 | 1 | 8 |
| 1 | 4 | 2 | 2 | 9 |
| 2 | 2 | 1 | 4 | 9 |
| 2 | 2 | 4 | 1 | 9 |
| 2 | 2 | 4 | 4 | 9 |
| 2 | 3 | 4 | 4 | 9 |
| 3 | 2 | 4 | 4 | 9 |
| 4 | 1 | 2 | 2 | 9 |
| 4 | 4 | 2 | 2 | 9 |
| 4 | 4 | 2 | 3 | 9 |
| 4 | 4 | 3 | 2 | 9 |
| 1 | 4 | 2 | 3 | 10 |
| 1 | 4 | 3 | 2 | 10 |
| 2 | 3 | 1 | 4 | 10 |
| 2 | 3 | 4 | 1 | 10 |
| 3 | 2 | 1 | 4 | 10 |
| 3 | 2 | 4 | 1 | 10 |
| 4 | 1 | 2 | 3 | 10 |
| 4 | 1 | 3 | 2 | 10 |
| 1 | 2 | 2 | 2 | 11 |
| 2 | 1 | 2 | 2 | 11 |
| 2 | 2 | 1 | 2 | 11 |
| 2 | 2 | 2 | 1 | 11 |
| 2 | 2 | 2 | 2 | 11 |
| 2 | 2 | 2 | 3 | 11 |
| 2 | 2 | 2 | 4 | 11 |
| 2 | 2 | 3 | 2 | 11 |
| 2 | 2 | 3 | 4 | 11 |
| 2 | 2 | 4 | 2 | 11 |
| 2 | 2 | 4 | 3 | 11 |
| 2 | 3 | 2 | 2 | 11 |
| 2 | 3 | 2 | 4 | 11 |
| 2 | 3 | 4 | 2 | 11 |
| 2 | 4 | 2 | 2 | 11 |
| 2 | 4 | 2 | 3 | 11 |
| 2 | 4 | 3 | 2 | 11 |
| 3 | 2 | 2 | 2 | 11 |
| 3 | 2 | 2 | 4 | 11 |
| 3 | 2 | 4 | 2 | 11 |
| 3 | 4 | 2 | 2 | 11 |
| 4 | 2 | 2 | 2 | 11 |
| 4 | 2 | 2 | 3 | 11 |
| 4 | 2 | 3 | 2 | 11 |
| 4 | 3 | 2 | 2 | 11 |
| 1 | 2 | 2 | 3 | 12 |
| 1 | 2 | 3 | 2 | 12 |
| 2 | 1 | 2 | 3 | 12 |
| 2 | 1 | 3 | 2 | 12 |
| 2 | 3 | 1 | 2 | 12 |
| 2 | 3 | 2 | 1 | 12 |
| 2 | 3 | 2 | 3 | 12 |
| 2 | 3 | 3 | 2 | 12 |
| 2 | 3 | 3 | 4 | 12 |
| 2 | 3 | 4 | 3 | 12 |
| 3 | 2 | 1 | 2 | 12 |
| 3 | 2 | 2 | 1 | 12 |
| 3 | 2 | 2 | 3 | 12 |
| 3 | 2 | 3 | 2 | 12 |
| 3 | 2 | 3 | 4 | 12 |
| 3 | 2 | 4 | 3 | 12 |
| 3 | 4 | 2 | 3 | 12 |
| 3 | 4 | 3 | 2 | 12 |
| 4 | 3 | 2 | 3 | 12 |
| 4 | 3 | 3 | 2 | 12 |
| 1 | 2 | 4 | 4 | 13 |
| 1 | 4 | 2 | 4 | 13 |
| 1 | 4 | 4 | 2 | 13 |
| 1 | 4 | 4 | 4 | 13 |
| 2 | 1 | 4 | 4 | 13 |
| 2 | 4 | 1 | 4 | 13 |

TABLE 7-continued

| S1 | S2 | S3 | S4 | Logic Gate |
|---|---|---|---|---|
| 2 | 4 | 4 | 1 | 13 |
| 2 | 4 | 4 | 4 | 13 |
| 3 | 4 | 4 | 4 | 13 |
| 4 | 1 | 2 | 4 | 13 |
| 4 | 1 | 4 | 2 | 13 |
| 4 | 1 | 4 | 4 | 13 |
| 4 | 2 | 1 | 4 | 13 |
| 4 | 2 | 4 | 1 | 13 |
| 4 | 2 | 4 | 4 | 13 |
| 4 | 3 | 4 | 4 | 13 |
| 4 | 4 | 1 | 2 | 13 |
| 4 | 4 | 1 | 4 | 13 |
| 4 | 4 | 2 | 1 | 13 |
| 4 | 4 | 2 | 4 | 13 |
| 4 | 4 | 3 | 4 | 13 |
| 4 | 4 | 4 | 1 | 13 |
| 4 | 4 | 4 | 2 | 13 |
| 4 | 4 | 4 | 3 | 13 |
| 4 | 4 | 4 | 4 | 13 |
| 1 | 2 | 1 | 4 | 14 |
| 1 | 2 | 4 | 1 | 14 |
| 1 | 4 | 1 | 2 | 14 |
| 1 | 4 | 1 | 4 | 14 |
| 1 | 4 | 2 | 1 | 14 |
| 1 | 4 | 3 | 4 | 14 |
| 1 | 4 | 4 | 1 | 14 |
| 1 | 4 | 4 | 3 | 14 |
| 2 | 1 | 1 | 4 | 14 |
| 2 | 1 | 4 | 1 | 14 |
| 3 | 4 | 1 | 4 | 14 |
| 3 | 4 | 4 | 1 | 14 |
| 4 | 1 | 1 | 2 | 14 |
| 4 | 1 | 1 | 4 | 14 |
| 4 | 1 | 2 | 1 | 14 |
| 4 | 1 | 3 | 4 | 14 |
| 4 | 1 | 4 | 1 | 14 |
| 4 | 1 | 4 | 3 | 14 |
| 4 | 3 | 1 | 4 | 14 |
| 4 | 3 | 4 | 1 | 14 |
| 1 | 2 | 2 | 4 | 15 |
| 1 | 2 | 4 | 2 | 15 |
| 2 | 1 | 2 | 4 | 15 |
| 2 | 1 | 4 | 2 | 15 |
| 2 | 4 | 1 | 2 | 15 |
| 2 | 4 | 2 | 1 | 15 |
| 2 | 4 | 2 | 4 | 15 |
| 2 | 4 | 3 | 4 | 15 |
| 2 | 4 | 4 | 2 | 15 |
| 2 | 4 | 4 | 3 | 15 |
| 3 | 4 | 2 | 4 | 15 |
| 3 | 4 | 4 | 2 | 15 |
| 4 | 2 | 1 | 2 | 15 |
| 4 | 2 | 2 | 1 | 15 |
| 4 | 2 | 2 | 4 | 15 |
| 4 | 2 | 3 | 4 | 15 |
| 4 | 2 | 4 | 2 | 15 |
| 4 | 2 | 4 | 3 | 15 |
| 4 | 3 | 2 | 4 | 15 |
| 4 | 3 | 4 | 2 | 15 |
| 1 | 2 | 1 | 2 | 16 |
| 1 | 2 | 2 | 1 | 16 |
| 1 | 2 | 3 | 4 | 16 |
| 1 | 2 | 4 | 3 | 16 |
| 2 | 1 | 1 | 2 | 16 |
| 2 | 1 | 2 | 1 | 16 |
| 2 | 1 | 3 | 4 | 16 |
| 2 | 1 | 4 | 3 | 16 |
| 3 | 4 | 1 | 2 | 16 |
| 3 | 4 | 2 | 1 | 16 |
| 3 | 4 | 3 | 4 | 16 |
| 3 | 4 | 4 | 3 | 16 |
| 4 | 3 | 1 | 2 | 16 |
| 4 | 3 | 2 | 1 | 16 |
| 4 | 3 | 3 | 4 | 16 |
| 4 | 3 | 4 | 3 | 16 |

A CIRCUIT 1800 gate may certainly be utilized to achieve a reconfigurable universal logic device. By setting the neural states, Table 7 shows that any logic gate can be attained. One problem, however, is the redundancy. Four neurons, each capable of occupying 4 states, lead to 256 possible combinations. To achieve universal logic function, we only need 16 states, or two neurons. By evaluating Table 7, one can identify a subspace of neural states where two out of the four neuronal states do not change. In this way, we only need change the states of two neurons. Take, for instance, the case where Neuron 1 (N1) is in State 1 and Neuron 2 (N2) is in state 2. In this case, we can find the following subspace in Table 8:

TABLE 8

| S1 | S2 | S3 | S4 | LF |
|---|---|---|---|---|
| 1 | 1 | 2 | 1 | 6 |
| 1 | 1 | 2 | 2 | 1 |
| 1 | 1 | 2 | 3 | 2 |
| 1 | 1 | 2 | 4 | 5 |
| 1 | 2 | 2 | 1 | 16 |
| 1 | 2 | 2 | 2 | 11 |
| 1 | 2 | 2 | 3 | 12 |
| 1 | 2 | 2 | 4 | 15 |
| 1 | 3 | 2 | 1 | 8 |
| 1 | 3 | 2 | 2 | 3 |
| 1 | 3 | 2 | 3 | 4 |
| 1 | 3 | 2 | 4 | 7 |
| 1 | 4 | 2 | 1 | 14 |
| 1 | 4 | 2 | 2 | 9 |
| 1 | 4 | 2 | 3 | 10 |
| 1 | 4 | 2 | 4 | 13 |

Multiple subspaces can be found in table 7 that cover all logic functions. Table 9 shows one more example, where neuron two is in state 1 and neuron 4 is in state 2.

TABLE 9

| S1 | S2 | S3 | S4 | LF |
|---|---|---|---|---|
| 1 | 1 | 2 | 2 | 1 |
| 1 | 1 | 2 | 3 | 2 |
| 1 | 1 | 4 | 2 | 5 |
| 1 | 1 | 1 | 2 | 6 |
| 2 | 1 | 2 | 2 | 11 |
| 2 | 1 | 3 | 2 | 12 |
| 2 | 1 | 4 | 2 | 15 |
| 2 | 1 | 1 | 2 | 16 |
| 3 | 1 | 2 | 2 | 3 |
| 3 | 1 | 3 | 2 | 4 |
| 3 | 1 | 4 | 2 | 7 |
| 3 | 1 | 1 | 2 | 8 |
| 4 | 1 | 2 | 2 | 9 |
| 4 | 1 | 3 | 2 | 10 |
| 4 | 1 | 4 | 2 | 13 |
| 4 | 1 | 1 | 2 | 14 |

Recall that the four possible states can be seen as a device function that either passes or inverts one of the inputs. We may use this to our advantage so as to illuminate the redundant circuitry. We have shown how various configurations can be used to implement a meta-stable switch synapse that encodes both a state and a magnitude. For the following example, we will use the configuration of two pre-synaptic electrodes and one post-synaptic electrode per synaptic junction. In this configuration, pre-synaptic signals are represented by differential electrode pairs: X1,~X1 and X2,~X2, where ~ indicates the logical complement.

Given the differential representation, one can see how a neural state can be permanently emulated by a direct connection to one of the input lines. For example, Neural State 1 is consistence with a direct connection to X2 and Neural State 2 is consistent with a direct connection to ~X2. To take advantage of the logic subspace shown in the tables above, as well as the differential pre-synaptic electrode configuration, we may simplify the circuitry as shown in system 1900 of FIG. 19.

By application of a teaching and a teach-enable signal, it is a simple matter to initialize the neurons in the ULG into the desired states. Indeed, teaching is simply the process of forcing a neuron into a pre-determined state. We may do this by selectively charging or grounding the post-synaptic electrodes. To achieve independent control over all neuron states within the ULG, a separate teaching could be used for each neuron. This would require 2 teach input lines, 1 teach enable line, as well as the two input and one output line. There are many ways to initialize the neural states. We will describe one such way as an illustration of the kind of data-stream manipulations that are possible. It should be apparent from this that there are many possibilities.

Consider a subspace where the state of neurons 2 and 4 determine the logic function of the ULG. Further consider a DataStream composed of the data vectors:

[1,1],[1,−1],[−1,1],[−1,−1]

To initialize a neuron into logic function 6, for example, we would provide training signals consistent with neural state 1 for both N1 and N2. If the input vectors undergo a rotation, or a series of substitutions, then we can emulate another neural state. To illustrate this, consider that the output of a neuron in state 1, when subjected to the data vectors above, will generate the following output: 1, −1, 1, −1. If we wanted to initialize N1 into state 1, but N2 into state 2, then we could present the data vector set [1,1],[1,−1],[−1,1],[−1,−1] to N1 and the data vector set [1,−1], [1,1], [−1,−1], [−1,1] to N2. In this way, each neuron is receiving the same training signals, but the inputs have undergone a transformation so that N1 is receiving training signals consistent with state 1 and N2 state 2. One complete circuit diagram capable of this can be seen in FIG. 20, which illustrates a system 2000 that functions as a universal logic gate (ULG).

System 2000 generally includes two input terminals 2002 and 2004 to which respective inputs 1 and 2 can be provided. Input 1 (i.e., input 2002) and input 2 (i.e., Input 2004) can be provided as binary voltages at input terminals 2002 and 2004, respectively. Inverters 2014 and 2018 provide the inverted, or compliment, voltage signal so as to represent the inputs on a differential electrode pair, discussed in FIGS. 3a-3c. Meta-stable switch assemblies 2006, 2008, 2010 and 2012 provide a resistive connection to one input electrode of NAND logic gate 1702. Likewise, Meta-stable switch assemblies 2020, 2022, 2024 and 2026 provide a resistive connection to one input electrode of NAND logic gate 1804. Via 2016 provides a direct connection to one input electrode of NAND 1702. Likewise, Via 2018 provides a direct connection to one input electrode of NAND 1804.

A tri-state voltage keeper circuit, provided by inverters 2036 and 2034, can provide a positive feedback signal capable of saturating the electrode voltage when activated by the evaluate enable control lines. Likewise, a tri-state voltage keeper circuit, provided by inverters 2038 and 2040 provide a positive feedback signal capable of saturating the electrode voltage when activated by the evaluate enable control lines. Transistors 2030 and 2032 may provide a conducting path between teach 1 and teach 2 control lines and there respective electrodes when activated by a teach enable control line. NAND logic gates 1702, 1804 and 1806 provide a logical transformation of the four input lines. Circuit 2048 provides for a routing circuit capable of directing either the output of inverter 2045 or the output of NAND 1806 to output line 2050. Circuit 2048 can provide a logic bypass so as to implement a flip cycle for second-level logic.

To understand why the output must change while the training signal is applied, so as to explain circuit 2048, it is necessary to understand the flip/lock cycle, which has been previously discussed. To summarize, it is necessary for the pre-synaptic electrode to flip states if the flip/lock cycle is to properly emulate the AHAH rule. If more than one ULG are connected together, so that the output of one ULG is the input to another, then we must insure that a configuration exists so that the output of the first ULG flips states. If one studies the state diagrams of Table 3 it is apparent that these states satisfy this requirement. In other words, whatever input vector one may choose, and in whatever state the neuron may be, if one takes the compliment vector, the output of the neuron is guaranteed to flip states. In this manner, if the output of the ULG is configured so that the NAND circuitry is by-passed, when the input to the ULG is flipped the output will also flip. The importance of this is that a ULG connected to the first ULG will receive the flip state, which allows the AHAH plasticity rule to be properly implemented via the flip/lock cycle. It may also be convenient to have independent control over the NAND bypass. In this case, one can control this via an independent control line, rather than linking it to the teach enable control line.

Based on the foregoing, it can be appreciated that a general methodology for utilizing unreliable meta-stable switches has been disclosed, which include a plurality of nanoscale meta-stable switching devices each having a plurality of allowable conductive states, wherein the plurality of meta-stable switches comprise resistive connects. A plasticity mechanism is also provided, which is based on a plasticity rule for creating stable connections from the plurality of meta-stable switches and can be configured to implement, for example, a universal reconfigurable logic gate. The plasticity mechanism can be based, for example, on a 2-dimensional binary input data stream, depending upon design considerations. A circuit is also associated with the plurality of meta-stable switches, wherein the circuit provides a logic bypass that implements a flip-cycle for second-level logic. Additionally, an extractor logic gate is associated with the plurality meta-stable switches, wherein the extractor logic gate provides logic functionalities.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A memristor, comprising:
   a plurality of meta-stable switching elements; and
   an AHAH (Anti-Hebbian and Hebbian) feedback mechanism that operates on said plurality of meta-stable switching elements to comprise said memristor.

2. The memristor of claim 1, wherein said plurality of meta-stable switching elements are driven by an AHAH rule.

3. The memristor of claim 2, wherein said AHAH rule is provided by said AHAH feedback mechanism.

4. The memristor of claim 3, wherein said memristor comprising said plurality of meta-stable switching elements and said AHAH feedback mechanism is employed an adaptive synaptic weight.

5. The memristor of claim 4, wherein said memristor comprising said plurality of meta-stable switching elements and said AHAH feedback mechanism extracts independent components from a data stream.

6. The memristor of claim 4, wherein said memristor is capable of being employed as a discrete state synapse.

7. A method of configuring a memristor, comprising:
provide a plurality of meta-stable switching elements; and
configuring an AHAH (Anti-Hebbian and Hebbian) feedback mechanism that operates on said plurality of meta-stable switching elements to comprises said memristor.

8. The method of claim 7, further comprising:
driving said plurality of meta-stable switching elements via an AHAH rule.

9. The memristor of claim 8 wherein said AHAH rule is provided by said AHAH feedback mechanism.

10. The method of claim 9 wherein said memristor comprises said plurality of meta-stable switching elements and said AHAH feedback mechanism are employed an adaptive synaptic weight.

11. The method of claim 10 wherein said memristor comprises said plurality of meta-stable switching elements and said AHAH feedback mechanism extracts independent components from a data stream.

12. The method of claim 11 wherein said memristor is capable of being employed as a discrete state synapse.

* * * * *